United States Patent
Pfeiffer

(10) Patent No.: US 12,050,240 B2
(45) Date of Patent: Jul. 30, 2024

(54) RADOME MEASURING SYSTEM AND METHOD

(71) Applicant: Perisens GmbH, Feldkirchen (DE)

(72) Inventor: Florian Pfeiffer, Kirchheim b. München (DE)

(73) Assignee: Perisens GmbH, Feldkirchen (DE)

( * ) Notice: Subject to any disclaimer, the term of this patent is extended or adjusted under 35 U.S.C. 154(b) by 547 days.

(21) Appl. No.: 17/284,342

(22) PCT Filed: Oct. 10, 2019

(86) PCT No.: PCT/EP2019/077526
§ 371 (c)(1),
(2) Date: Apr. 9, 2021

(87) PCT Pub. No.: WO2020/074667
PCT Pub. Date: Apr. 16, 2020

(65) Prior Publication Data
US 2021/0349138 A1    Nov. 11, 2021

(30) Foreign Application Priority Data

Oct. 12, 2018 (EP) .................................. 18200240

(51) Int. Cl.
*G01R 29/08* (2006.01)
*G01R 27/26* (2006.01)
(Continued)

(52) U.S. Cl.
CPC ..... *G01R 29/0871* (2013.01); *G01R 27/2623* (2013.01); *G01S 7/03* (2013.01); *G01S 7/4004* (2013.01); *H01Q 1/42* (2013.01)

(58) Field of Classification Search
CPC ............ G01R 33/0017; G01R 33/0088; G01R 33/028; G01R 33/0082; G01R 33/0029; G01R 33/0041
See application file for complete search history.

(56) References Cited

U.S. PATENT DOCUMENTS 3,936,736 A    2/1976 Ray
5,066,921 A    11/1991 Rope et al.
(Continued)

FOREIGN PATENT DOCUMENTS

CN    201069457 Y1    6/2008
CN    102857310 A    1/2013
(Continued)

OTHER PUBLICATIONS

International Search Report and Written Opinion received in International Application No. PCT/EP2019/077526.
(Continued)

*Primary Examiner* — Alvaro E Fortich
(74) *Attorney, Agent, or Firm* — ALG Intellectual Property, LLC

(57) ABSTRACT

A radome measuring system configured to perform a radome measurement may include at least one transmission antenna configured for emitting electromagnetic waves, at least one receiving antenna configured for receiving electromagnetic waves, and a measuring device configured to measure at least one difference between the transmitted and received electromagnetic waves for inferring a feature of a radome positioned between the at least one transmission antenna and the at least one receiving antenna. The radome measuring system may be used to measure the effects of a radome on electromagnetic waves traversing through the radome.

18 Claims, 9 Drawing Sheets

(51) Int. Cl.
 *G01S 7/03* (2006.01)
 *G01S 7/40* (2006.01)
 *H01Q 1/42* (2006.01)

(56) References Cited

U.S. PATENT DOCUMENTS

| | | | | |
|---|---|---|---|---|
| 5,371,505 | A | * 12/1994 | Michaels | H01Q 1/42 |
| | | | | 324/639 |
| 2014/0300519 | A1 | 10/2014 | Estebe et al. | |
| 2015/0115978 | A1 | 4/2015 | Bories et al. | |
| 2017/0356941 | A1 | * 12/2017 | Ahmed | G01S 7/4004 |
| 2018/0115086 | A1 | 4/2018 | Olfert et al. | |
| 2020/0096631 | A1 | * 3/2020 | Egard | A01D 34/008 |

FOREIGN PATENT DOCUMENTS

| CN | 106507895 B | 6/2014 |
|---|---|---|
| CN | 104714086 A | 6/2015 |
| CN | 105319266 A | 2/2016 |
| CN | 205385485 U | 7/2016 |
| CN | 106405297 | 2/2017 |
| CN | 106405297 A | 2/2017 |
| CN | 205921069 U | 2/2017 |
| CN | 107298394 A | 10/2017 |
| CN | 107505603 A | 12/2017 |
| CN | 107643452 A | 1/2018 |
| EP | 3258288 | 12/2017 |
| FR | 2661249 A1 | 10/1991 |
| JP | 2009054564 A | 3/2009 |
| WO | 2018173518 A1 | 9/2018 |

OTHER PUBLICATIONS

Zhichao, Li et al., "RCS Measurement and Analysis of FSS." vol. 31 No. 2 Apr. 2015. 1005-6122(2015)02-0050-05. DOI: 10. 14183 / j. cnki. 1005-6122. Feb. 11, 2015.

* cited by examiner

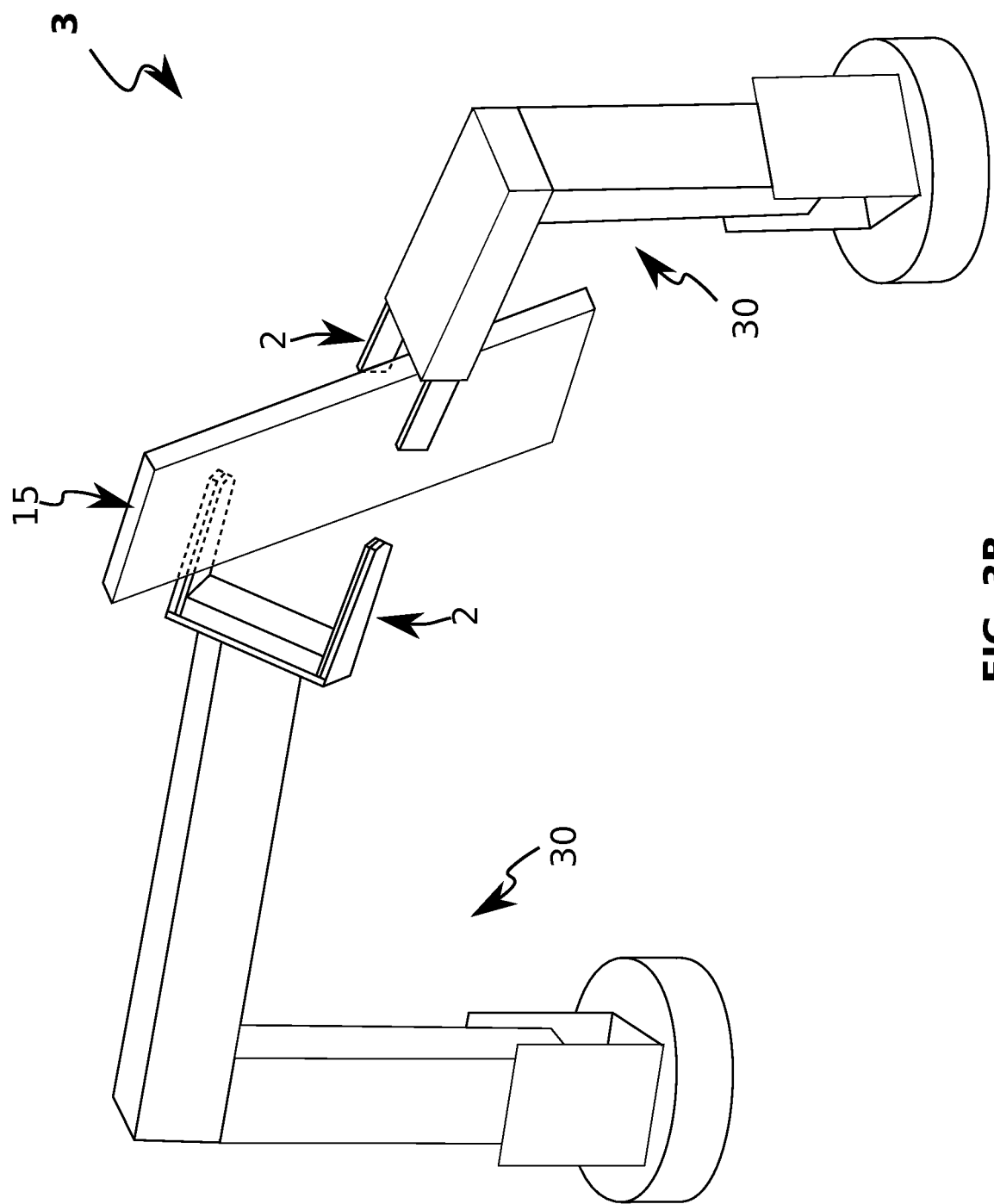

RADOME MEASURING SYSTEM AND METHOD

FIELD OF INVENTION

The present invention generally relates to a method and system for testing radomes. More particularly, a method and system for measuring dielectric characteristics of radomes is presented.

INTRODUCTION

Radars are detection system or sensors that use electromagnetic waves to determine range, angle or velocity of objects. A radar usually consists of a transmitting unit, or antenna, that radiates electromagnetic waves. The frequency of the emitted electromagnetic wave, or the operational frequency of the radar, can be within a wide range of the electromagnetic spectrum, usually within the radio and microwave part of the spectrum and depends on the use scenario of the radar. The lower the operational frequency of the radar the higher the detection range, as the transmitted electromagnetic waves are less attenuated or affected by external factors, e.g. by weather conditions, radar covers, etc. On the other hand, high frequencies offer a better accuracy and resolution of detection due to the smaller wavelength, but at the same time are highly susceptible to attenuation.

An emerging technology is the use of radar systems in automotive industry. More particularly, radars operating in high frequencies, such as, 20 to 130 gigahertz (GHz), usually between 70 and 90 GHz, can provide a very high range resolution and achievable accuracy. This feature makes such radars preferable for use in parking assistants, blind spot monitoring, brake assistant systems, etc. However, due to the very high operating frequency, such radar systems suffer from high signal attenuation.

A radar is usually set to operate in open-air conditions. Thus, the radar is exposed to different weather conditions, dust or other external particles and forces that may damage the radar and/or lower the accuracy of its measurements. In cars the radars are wanted to be covered for esthetic reasons so that they are not visible. To cope with this, a radome, also referred as a radar dome or radar cover, is implemented around the radar, hence protecting it against external factors and/or making it invisible.

The radome may negatively influence the operation of the radar. Due to dielectric characteristics of the radome material, the radome may cause unwanted reflections, attenuation, beam deflection, beam broadening, sidelobe increase, etc. These side effects may introduce errors in the radar sensing. The unwanted effects caused by the radome, particularly attenuation, become significant when the radar operates in high frequencies. For example, the radars operating in high frequencies, usually used in automotive industry are highly susceptible to suffer from attenuation and other unwanted effects caused by the radome.

Thus, in one hand it is advantageous for various reasons (e.g. protection against weather conditions or external elements or forces and/or improving vehicle design) to cover the radar sensor with a radome, while on the other hand the radome introduces many unwanted effects (e.g. signal attenuation) that may increase the inaccuracy or decrease the detection or sensing capability of the radar.

Furthermore, the use of radar systems in vehicles, such as for parking assistance, blind spot monitoring, braking assistance, etc., are prone to strict requirements set by legal standards, such that maximum safety can be ensured for traffic participants. These standards or regulations usually require high detection accuracy.

Some attempts that tackle this issue are already present in the state of the art. They are mostly based on measurements with radar sensors, wherein radar test targets, usually reflectors, are positioned within a certain distance from the radar sensor and the reflection power is measured, with and without a radome. The difference between the two power values is used to quantify the attenuation caused by the radome.

For example, U.S. Pat. No. 5,371,505A discloses a method for determining signal transmission characteristics for a selected area of a radome the method comprising the steps of radiating a test signal toward said selected area of said radome, reflecting said test signal from a predetermined first reflection position, after said test signal has passed through said selected area of said radome, to provide a reflected test signal, receiving said reflected test signal, storing data representative of said reflected test signal, repeating the above steps with said predetermined first reflection position changed to a predetermined second reflection position and processing said stored data to provide data representative of signal transmission characteristics for said selected area of said radome.

U.S. Pat. No. 3,936,736A discloses a hand held universal radome tester which is an instrument for locating discontinuities and impurities inside a radome wall and for determining the quality of an anti-static paint coating over the exterior surface of a radome. It includes a microwave segment which is energized in the discontinuities/impurities mode of operation to measure energy reflected by the radome wall, and a dc segment which is energized in the anti-static paint tester mode to measure resistance in megohms per square. The tester is battery-operated making it a completely portable device.

The above-mentioned publications, as discussed, are based on indirect measurements via reflection measurement. However, reflection-based measurements of the radome dielectric properties may introduce measurement errors.

SUMMARY

It is an object of the present invention to provide a better and/or alternative system and method for measuring dielectric properties of radomes used in radar systems. The measurements realized by the presented system and method may provide more insight into the expected unwanted effects caused by the radome, hence allowing for the reversing or compensation of such effects. This may increase the detection accuracy of the radar sensor, as well as the range of detection.

In a first embodiment a radome measuring system is disclosed. The radome measuring system is configured to perform a radome measurement.

A radome, or radar dome, is a structural enclosure implemented around a radar sensor (or radar) for protecting the radar. The radome can be weatherproof, thus, protecting the radar sensor from humidity, temperature, dust, etc. While in some cases the radome can be built specifically for protecting the radar, in other cases the radar can be hidden behind a structure, which can play the role of the radome. For example, in cars or robots, the radars can be hidden inside the enclosures of the car or robot (e.g. hidden behind the bumpers of the car) for esthetic reasons or for protecting the radars. The enclosure would act as a radome, hiding the radar sensor and protecting it from external factors, such as, weather.

However, as the radome interrupts the path of the signals transmitted and received by the radar sensor, the radome may affect these signals and as a consequence may lower the sensitivity and accuracy of the radar sensing. For example, the radome may cause attenuation, reflection, refraction, scattering etc., of the electromagnetic waves that pass through it.

Thus, in one hand it can be advantageous to use the radome for protecting the radar and/or esthetic reasons, while on the other hand the radome interferes with the sensing of the radar. The first embodiment of the current invention, addresses this issue by providing a system configured to perform a radome measurement.

The radome measurement can comprise measuring electromagnetic, transmission and/or reflection properties of a radome, radome material, radome sample. For example, during a radome measurement the following effects caused by the radome on the antenna (or radar or sensor) it is covering, can be measured and/or inferred: attenuation of an electromagnetic wave traversing through the radome, reflection of electromagnetic waves hitting the radome, deflection of the main beam of the antenna, increasing of the beam width of the antenna, extension of sidelobes of the antenna, etc. Alternatively or additionally, during a radome measurement the scattering parameters, or S-parameters, can be measured and/or calculated and/or inferred.

The information gained by measuring the effect that the radome can have on the electromagnetic waves traversing through it, can be used to compensate for the effect of the radome during radar sensing. Hence, the sensing and accuracy of the radar covered by the radome can be improved.

Further, the radome measuring system can also provide a manner of testing radomes if they meet preset requirements. For example, the radome measuring system can measure the attenuation of a signal on a certain frequency range, caused by the radome and can determine if the radome meets a preset requirement stating the maximum tolerable attenuation that the radome can cause to electromagnetic waves.

This can be particularly advantageous on radars used in cars, i.e. automotive radars. In one hand, the automotive radars operate in high frequency ranges, such as, 70-90 GHz. Thus, the influence of the radome in this high frequency signals can be significant. On the other hand, strict requirements may be imposed by respective authorities, on the accuracy that automotive radar sensors should comprise, to ensure safety of traffic participants. Thus, testing radomes and their effect can be advantageous, to prove (or disprove) that, a radome or a radar system meets the preset requirements.

The radome measuring system comprises at least one transmission antenna, configured for emitting electromagnetic waves and at least one receiving antenna, configured for receiving electromagnetic waves. Thus, a measuring signal or electromagnetic wave can be transmitted from the at least one transmission antenna to the at least one receiving antenna. Additionally, the radome measuring system comprises a measuring device, configured to measure at least one difference between the transmitted and received electromagnetic waves. If a radome or radome sample is positioned between the at least one transmission antenna and at least one receiving antenna, the at least one difference between the transmitted and received electromagnetic waves is used to infer a feature of the radome. In other words, if the electromagnetic waves emitted by the at least one transmission antenna, traverse through a radome or radome sample before being received at the at least one receiving antenna, the at least one difference between the transmitted and received electromagnetic waves is used to infer a feature of the radome. The inferred or deduced feature of the radome can comprise the level of attenuation, reflection, refraction, scattering, etc., that the radome can cause. The inferred or deduced feature of the radome can also comprise a decision or determination whether the radome meets one or more preset requirements regarding the effect it can have on the sensing of a radar sensor. The inferred or deduced feature of the radome can also be used to infer an accuracy or sensing indicator of the radar system wherein the radome under test is intended for use.

In some embodiments, the electromagnetic waves transmitted by the at least one transmission antenna can traverse at least a section or part of the radome. That is, the radome can be positioned between the transmission and receiving antennas, such that, one of its surfaces can face toward the at least one transmission antenna. While in some embodiments the entire surface of the radome can be traversed by the electromagnetic waves emitted by the at least one transmission antenna, in some other embodiments, only part or a section of the said area of the radome can be traversed or selected to be traversed by the electromagnetic waves emitted by the at least one transmission antenna. This can allow a certain part of the radome to be selected or targeted for testing. That is, in some instances the radome can comprise a large structure or can be part of a larger structure, while only a certain part of the radome (or the larger structure) can be expected to be traversed by the signals transmitted and/or received by the radar that is covered by it. Hence, instead of testing the whole radome (or larger structure) a part or section can be selected or targeted for testing, which may correspond to the part that is expected to be traversed by the signals transmitted and/or received by the radar covered by the radome.

The radome measuring system can be configured to measure the attenuation of an electromagnetic wave traversing through the radome. Alternatively or additionally, the radome measuring system can be configured to measure the reflection of electromagnetic waves caused by the radome. Alternatively or additionally, the radome measuring system can be configured to measure deflection of the main beam of the transmitter antenna. Alternatively or additionally, the radome measuring system can be configured to measure increasing of the beam width of the transmission antenna. Alternatively or additionally, the radome measuring system can be configured to measure extension of sidelobes of the transmission antenna. Alternatively or additionally, the radome measuring system can be configured to measure the scattering parameters, or S-parameters, describing the transmission of electromagnetic waves from the at least one transmission antenna, through the radome under test and to the at least one receiving antenna.

The at least one transmission antenna and the at least one receiving antenna can be aligned, such that, the main lobe of the at least one transmission antenna (10T) and the main lobe of the at least one receiving antenna can intersect. When multiple transmission antennas and multiple receiving antennas are used, the alignment can be done one-by-one, wherein each transmission antenna is aligned with one receiving antenna, or one-to-many wherein multiple receiving antennas can receive from the same transmission antennas, or many-to-one wherein one receiving antenna can receive from multiple transmission antennas, or many-to-many wherein any transmission antenna can transmit to any receiving antenna. The different aligning configurations can provide multiple ways of performing the radome measurement. For example, in a one-to-one alignment, a single measurement or multiple independent measurements of the radome can be done by the aligned pair of transmission and receiving antenna, i.e. each one-to-one pair of transmission and receiving antennas can measure a corresponding area of the radome.

The at least one transmission antenna can be configured to emit or radiate electromagnetic waves with a frequency range between 20-130 GHz, preferably, between 70-90 GHz.

The at least one receiving antenna can be configured to receive electromagnetic waves with a frequency range between 20-130 GHz, preferably, between 70-90 GHz.

Preferably, the at least one transmission antenna and the at least one receiving antenna can be configured to operate on the same frequency range. This can allow a signal that is transmitted from the at least one transmission antenna to be received by the at least one receiving antenna. More preferably, aligned pairs of transmission and receiving antennas can be configured to operate on the same frequency range. That is, different aligned pairs can operate on different frequency ranges while the antennas within the aligned pairs operate with the same frequency. This can allow that multiple radome measurements for different frequency ranges of the measuring signals to be carried out simultaneously.

Furthermore, the frequency range between 20-130 GHz, preferably, between 70-90 GHz can be advantageous as it matches with the operational frequency range used by radars, particularly automotive radars. Hence, the effect that the radome can have on an automotive radar can be tested.

In some embodiments, the radome can be positioned between the antennas, such that, it can deviate the reflections that may be created between the at least one transmission antenna and the radome and/or between the at least one receiving antenna and the radome. It can be advantageous to position the radome in an inclined manner (i.e. not perpendicular to the signal transmission path or the boresight axis of the transmission antenna). The inclination angle of the radome can be 20° to 160°. The inclination of the radome can be created by rotating the radome according to a horizontal and/or vertical axis of rotation, with a rotational angle preferably up to 70° (in both clockwise and anti-clockwise directions). In this context, horizontal and vertical directions are defined as observed by the antennas. For example, an axis parallel to the boresight axis of a transmission antenna is neither vertical, nor horizontal. While an axis perpendicular to the boresight axis of the transmission antenna, according to the up and down direction, represents the vertical axis. Similarly, an axis perpendicular to the boresight axis of the transmission antenna, according to the left and right direction, represents the horizontal axis. Note that the upper definitions of the axis (and directions of rotations) are provided for illustration purposes only and are not strict.

In some embodiments, the received signal can be provided to the measuring device in the same frequency range as transmitted from the transmission antenna and received by the receiving antenna, i.e. the RF signal is directly distributed to the measuring device. In such embodiments, the measuring device can be connected to the at least transmission antenna and to the at least one receiving antenna directly by a respective connector, and wherein the connectors can comprise electrical conductors (e.g. coaxial cables) and/or waveguides.

In another embodiment, at least one frequency converter can be used. More particularly, an up-converter can be used between the measuring device and the at least one transmission antenna and a down-converter can be used between the at least one receiving antenna and the measuring device. Thus, the measuring device can operate at an intermediate frequency (IF), e.g. 1-6 GHz, or at baseband (e.g. 0-3 GHz), while the antennas can transmit and/or receive RF signal at higher frequencies (i.e. RF range, e.g. 70-90 GHz). This can be advantageous as the measuring device can be configured to operate at a certain low frequency range (e.g. IF range or baseband), independent of the RF range of the signals transmitted between the transmitting and receiving antennas.

In some embodiments, the radome measuring system can further comprise at least one reflector positioned between the at least one transmission antenna and the radome (i.e. on the transmission side). Alternatively or additionally, the radome measuring system can comprise at least one reflector positioned between the radome and the at least one receiving antenna. The reflectors can be configured to deviate the reflections that may be created between the at least one transmission antenna and the radome and/or between the at least one receiving antenna and the radome. Thus, it can be advantageous to position at least one reflector in an inclined manner (i.e. not perpendicular to the signal transmission path or the boresight axis of the transmission antenna). The inclination angle of the at least one reflector can be between 30° to 80° or between 100° to 150°. The inclination of the reflector can be created by rotating the reflector according to a horizontal and/or vertical axis of rotation, with a rotational angle preferably between 10° to 60° (in both clockwise and anti-clockwise). In this context, horizontal and vertical directions are defined as observed by the antennas. For example, an axis parallel to the boresight axis of a transmission antenna is neither vertical nor horizontal. While an axis perpendicular to the boresight axis of the transmission antenna, according to the up and down direction, represents the vertical axis. Similarly, an axis perpendicular to the boresight axis of the transmission antenna, according to the left and right direction, represents the horizontal axis. Note that the upper definitions of the axis (and directions of rotations) are provided for illustration purposes only and are not strict.

In some embodiments, the at least one transmission antenna can be mounted on at least one transmitter mount and the at least one receiving antenna can be mounted on at least one receiver mount and wherein the transmitter mount and receiver mount can be configured for mounting and supporting at least one antenna. The antenna mounts can be advantageous as they can allow the alignment between the at least one transmission antenna and the at least one receiving antenna, such that, the signals emitted by the at least one transmission antenna can be received by the at least one receiving antenna. The antenna mounts, can also facilitate supporting the antennas in a stable manner during radome measurements.

In some embodiments, the radome measuring system can further comprise a clamp structure comprising a transmitter mount of the clamp configured for mounting at least one transmission antenna and a receiver mount of the clamp configured for mounting at least one receiver antenna and a base frame wherein the transmitter mount of the clamp and receiver mount of the clamp are attached such that a substantially U-shaped structure of the clamp can be created. The clamp structure can provide support for the at least one transmission antenna and the at least one receiving antenna and can facilitate positioning the at least one transmission antenna and the at least one receiving antenna facing each-other. Additionally, the clamp structure, particularly the base frame, can facilitate keeping the distance between the at least one transmission antenna and the at least one receiving antenna constant, at least during a radome measurement. Additionally still, the clamp structure can be advantageous as it can allow the position of the at least one transmission antenna and at least one receiving antenna to be changed, without changing the relative position between them. Thus, the antennas can be transported without changing the alignment between them.

In some embodiments of the radome measuring system, wherein the transmitter mount and the receiver mount can be provided, the clamp structure can be formed by attaching the transmitter mount and the receiver mount on opposing sides of the base frame. In such embodiments, the clamp structure can be more flexible. For example, the base frame can comprise multiple fixing points for the antenna mounts, hence allowing different configurations or alignments between the at least one transmission antenna and the at least one receiving antenna.

In some other embodiments, the clamp structure can be formed as a single part, that is, without mounting or assembling or attaching smaller parts together. In such embodiments, the clamp structure can be more stable or durable against external forces.

In some embodiments of the radome measuring system, wherein at least one reflector is provided, the at least one reflector can be attached to the clamp structure. This can be advantageous, as the antennas and the reflectors can be moved without changing the relative positioning between the antennas and the reflectors.

The radome measuring system can further comprise at least one positioning apparatus that can be configured to move the at least one transmission antenna and the at least one receiving antenna. The at least one positioning apparatus can be configured to independently move the at least one transmission antenna and the at least one receiving antenna. Thus, different alignments between the at least one transmission antenna and the at least one receiving antenna can be rendered by the at least one positioning apparatus independently moving the antennas. The positioning apparatus can alternatively or additionally be configured to move the at least one transmission antenna and the at least one receiving antenna together, such that, the relative position between the antennas is not altered. For example, the at least one transmission antenna and the at least one receiving antenna can be mounted on a clamp structure and the clamp structure can be mounted on the positioning apparatus, wherein the positioning apparatus can be configured to move the clamp structure. Furthermore, the positioning apparatus can be configured to position the antennas on different parts or sections of the radome. Hence, multiple parts or sections of the radome can be measured.

The radome measuring system can also comprise multiple positioning apparatuses, wherein each of them can be configured to support and transport corresponding transmission and receiving antennas. Thus, a radome can be measured simultaneously on different parts of it.

In some embodiments, the positioning apparatus can be a robotic arm. The robotic arm can comprise a robotic arm base that can be configured to support the robotic arm, i.e. keep the robotic arm stable and in a standing position. The robotic arm can further comprise a first prolonged member and a second prolonged member. The first prolonged member can be attached on one of its ends with the robotic arm base and on the other end with the second prolonged member. The second prolonged member can be attached on one of its ends with the first prolonged member on the other end with the at least one receiving antenna and with the at least one transmission antenna. Alternatively or additionally, the second prolonged member can be attached with respective mounting structures of the at least one transmission antenna and the at least one receiving antenna, such as, antenna mounts or clamp structure.

The robotic arm can be configured to allow or make possible the relative motion between the robotic arm base and first prolonged member. Alternatively or additionally, the robotic arm can be configured to allow or make possible the relative motion between the first prolonged member and second prolonged member.

In some embodiments, wherein the at least one transmission antenna and the at least one receiving antenna can be mounted on a clamp structure and the clamp structure can be mounted on the positioning apparatus, the joint between the clamp structure and the positioning apparatus can be configured to provide rotation of the clamp structure. This can allow the adjustment of the incidence angle of the measuring signals on the surface of the radome, independent from the position of the radome. Thus, also the angle of incidence of the measuring signals on the surface of the radome can be considered while performing a radome measurement.

In general, the positioning apparatus can comprise any degree of freedom. This can allow multiple relative positions between the at least one transmission antenna and at least one receiving antenna to be achieved. Thus, different parts or sections of the radome can be measured.

In some embodiments, the radome measuring system can comprise a radome handling apparatus that can be configured to move the radome. That is, the radome handling apparatus can be configured to grab and support the weight of a radome. Further, the radome handling apparatus can be configured to move or transport the radome. For example, the radome handling apparatus can be configured to grab the radome from a storage location and transport the radome until a part or section or all of the radome can be positioned between the at least one transmission antenna and the at least one receiving antenna. After the radome measurement is performed the radome handling apparatus can remove the radome from being positioned between the measuring antennas and can transport it to a further (or initial) storage location (or any other location, within the reaching range of the radome handling apparatus). Additionally, during the radome measurement, the radome handling apparatus can be configured to move the radome (e.g. in a zigzag pattern), such that, a section, part or all of the radome can be scanned and measured by the measuring antennas.

The distance between the at least one transmission antenna and the at least one receiving antenna can be between 10-100 centimeters (cm). Note that, the smaller the distance between the at least one transmission antenna and at least one receiving antenna, the harder it can be to compensate for reflections (e.g. using time-gating, see below) as the difference in time between the direct path (from transmission to receiving antenna) and the non-direct path (followed by reflections) can be too small and thus, hard to measure. To put it simply, if the distance between the antennas is small, then the direct path wave and the reflections arrive almost at the same time at the receiver antenna, which makes it harder to separate or distinguish them. On the other hand, if the distance between the at least one transmission antenna and the at least one receiving antenna is large, the beam of the at least one transmission antenna can be too broad when reaching the radome and the receiver antenna. This may increase the probability of the edges of the radome and/or of the receiving antennas to diffract the electromagnetic waves transmitted by the at least one transmission antenna. These diffractions can interfere with the measuring signals and ca influence the measurements. Usually, a distance between 10-100 cm between the at least one transmission antenna and the at least one receiving antenna can facilitate avoiding such effects.

In some embodiments, the at least one transmission antenna and the at least one receiving antenna can be transceiver antennas, that is, can be configured for both signal transmission and reception. This can allow the radome measurements to be performed in both directions.

The radome measuring system can comprise 1 to 100 transmission antennas and 1 to 100 receiving antennas. The increase of the number of antennas can allow more measuring points (or sections) of the radome to be simultaneously measured—hence, performing the radome measurement faster. However, the increase of the number of the antennas may increase the complexity of the radome measuring system, particularly of the measuring device of the radome measuring system, wherein more computational power may be required.

As discussed in a previous embodiment, the at least one transmission antenna and the at least one receiving antenna can be aligned, such that, the main lobe of the at least one transmission antenna and the main lobe of the at least one receiving antenna can intersect. For example, a perfect reception can be achieved if the boresight axes of a transmission antenna and the boresight axes of the receiving antenna are coincident. Nevertheless, a misalignment between the transmission and receiving antennas can be tolerated. The centers of the antennas can be misaligned by a tolerable maximum distance of 0.05 mm, preferably 0.1 mm, even more preferably 1 mm.

In a further embodiment, the radome measuring system can comprise a first robotic arm configured to support and handle at least one transmission antenna and a second robotic arm configured to support and handle at least one receiving antenna. In such embodiments, the alignment between the at least one transmission antenna and the at least one receiving antenna can be facilitated by a calibration step between the first robotic arm and the second robotic arm.

In a second embodiment a method of measuring the effects of a radome on electromagnetic waves traversing through the radome using the radome measuring system according to any of preceding system embodiments is disclosed.

The method comprises providing a radome between at least one transmission antenna and at least one receiving antenna. Thus, a measurement of the radome positioned between the at least one transmission antenna and at least one receiving antenna can be performed. Similarly, a radome sample, can be positioned between the at least one transmission antenna and at least one receiving antenna and can be used for measuring a radome.

The method further comprises triggering the at least one transmission antenna to radiate electromagnetic waves and receiving the said transmitted electromagnetic waves by the at least one receiving antenna. That is, a measuring signal can be transmitted from the at least one transmission antenna and can be received by the at least one receiving antenna. The measuring signal can, thus, traverse through the medium(s) provided between the at least one transmission antenna and at least one receiving antenna. Hence, as the radome can be provided between the at least one transmission antenna and at least one receiving antenna, the measuring signals can traverse the radome before being received by the at least one receiving antenna.

Additionally, the method comprises measuring at least one difference between the transmitted and received electromagnetic waves. That is, the electromagnetic waves as transmitted by the at least one transmission antenna can be compared with the corresponding electromagnetic waves as received by the receiving antenna. The changing of at least one feature of the electromagnetic wave, such as, signal power, can be measured. In other words, as discussed above, the measuring signal can traverse the medium(s) provided between the at least one transmission antenna and the at least one receiving antenna, including the radome (or radome sample). The radome (and/or other mediums between the antennas) can affect (e.g. attenuate, deflect) the signals traversing through it. Thus, the measuring signal can be changed during the transmission from the at least one transmission antenna to the at least one receiving antenna. This difference, can be measured, e.g. by comparing features (e.g. signal power) of the transmitted electromagnetic waves with features of the received electromagnetic waves.

Further, the method comprises inferring a feature of the radome based on the at least one difference between the transmitted and received electromagnetic waves. The inferred or deduced feature of the radome can comprise the level of attenuation, reflection, refraction, scattering, etc., that the radome can cause. The inferred or deduced feature of the radome can also comprise a decision or determination whether the radome meets one or more preset requirements regarding the effect it can have on the sensing of a radar sensor. The inferred or deduced feature of the radome can also be used to infer an accuracy or sensing indicator of the radar system wherein the radome under test is intended for use.

In some embodiments, the method can comprise performing referencing with an empty measurement. The referencing with an empty measurement can consist on performing a measurement without providing a radome between the at least one transmission antenna and at least one receiving antenna. That is, without providing a radome between the at least one transmission antenna and at least one receiving antenna, the at least one transmission antenna can be triggered to radiate electromagnetic waves which can be received by the at least one receiving antenna. This means that the measuring signal does not traverse through the radome before reaching the at least one receiving antenna. Further, at least one difference is measured between the transmitted and received electromagnetic waves. The referencing with an empty measurement can be advantageous as a feature of the medium (without the radome) between the transmission and receiving antennas can be inferred. The feature or measurement of the medium can be used to compensate the medium's effect on the radome measuring signals during a radome measurement. Thus, only the effect of the radome on the measuring signals (transmitted from the at least one transmission antenna to the at least one receiving antenna) can be considered.

In other words, the process of a radome measurement is based on measuring the effect of the mediums between the at least one transmission antenna and the at least one receiving antenna. The measuring signal can be affected by each of the mediums it traverses through and the medium between the at least one transmission antenna and at least one receiving antenna can comprise the radome, air, reflectors (e.g. see the radome measuring system embodiments comprising reflectors), etc. However, only the effect of the radome on the measuring signal can be advantageous to be measured for inferring a feature of the radome. Thus, referencing with an empty measurement, can allow the measurement of the effect of all other mediums between the at least one transmission antenna and the at least one receiving antenna without the radome. Hence, when a measurement of the radome is performed, the effect of the other mediums can be compensated.

In a similar manner, referencing with an empty measurement can allow, that further errors be compensated. For example, a misalignment between the transmission and receiving antenna can cause extra difference between the transmitted and received electromagnetic waves. This further effect on the measuring signal, caused by the misalignment between the antennas, can be measured during the referencing with an empty measurement and hence, can be compensated when the radome measurement is performed.

Referencing with an empty measurement, can allow the compensation of measurement errors that can be caused by temperature changes. Changes on the temperature of the environment can cause changes of the components of the radome measuring system. This can affect the operation of the components of the system, for example, the conversion gain of the frequency converters (if provided) can change with temperature. Furthermore, the propagation properties of the medium between the transmission and receiving antennas can also change when temperature changes. The above-mentioned effects (and also other effects that may be caused by temperature change of the environment) can be compensated by the referencing with an empty measurement.

Furthermore, as the medium(s) between the antennas can change, e.g. due to changing of temperature, humidity, dust, etc., it can be advantageous to perform the referencing with an empty measurement shortly, such as 1 to 10 seconds, before the radome measurement. In general, the more updated the effect of external factors on the measuring signal (such as, effect form other mediums other than the radome, misalignment of antennas, etc.) the more accurate the results of the radome measurement can be.

In some embodiments, the method can comprise performing a radome measurement at least one time, such as, 1 to 100 times, before inferring a feature of the radome. That is, the steps of triggering the at least one transmission antenna to radiate electromagnetic waves, receiving the transmitted electromagnetic waves by the at least one receiving antenna and measuring at least one difference between the transmitted and received electromagnetic waves can be repeated multiple time. The at least one difference between the transmitted and received electromagnetic waves, measured during at least one of the repetitions of the steps can be considered for inferring a feature of a radome. Put simply, multiple radome measurements can be performed and at least one of these measurements can be considered for inferring a feature of the radome.

In some embodiments, the method can further comprise the step of changing the relative position between the radome and the at least one transmission antenna. This can be achieved by moving the radome, or the at least one transmission antenna or a combination of both. This step can allow that different sections or parts of the radome to be measured or tested. In the above only changing the relative position between the radome and the at least one transmission antenna is discussed. However, similarly to or consequently from changing the relative position between the radome and the at least one transmission antenna, the relative position between the radome and the at least one receiving antenna can be changed.

In some embodiments, the method comprises performing a radome measurement and the step of changing the relative position between the radome and the at least one transmission antenna at least one time, such as, 1 to 100 times, before inferring a feature of the radome. That is, multiple parts or sections of the radome are measured and based on at least one of the measurements a feature of the radome can be inferred. Translational motion of the radome and/or the at least one transmission antenna can allow a scanning of the radome, wherein an area of the radome can be measured, i.e. the radome is tested in different measuring points. Alternatively or additionally, rotational motion of the radome and/or the at least one transmission antenna can allow to perform radome measurements for different incidence angles of the measuring signals emitted by the at least one transmission antenna.

While in the above embodiment, the radome feature is inferred after performing multiple radome measurements on different measuring points, in some other embodiments, multiple radome measurements can be performed, wherein after each radome measurement a feature of the radome can be inferred and wherein after each inferring of a radome feature the relative position between the radome and the at least one transmission antenna is changed. In other words, after a radome measurement, a feature of the radome can be inferred, then the relative position between the radome and the antennas can be changed and the process can be repeated for the other position between the radome and the antennas.

In some embodiments, the method can further comprise performing time-gating before the step of measuring at least one difference between the transmitted and received electromagnetic waves, such that, interference of the received signal considered while measuring at least one difference between the transmitted and received electromagnetic waves can be minimized. More particularly, the received signal at the at least one receiving antenna can be composed of the measuring signal transmitted directly from the at least one transmission antenna to the at least one receiving antenna and from reflections of the measuring signal created by the surface of the radome and/or antennas and/or other structures traversed or hit by the measuring signal. As the reflections follow a longer path then the direct transmission, the reflections arrive at the at least one receiving antenna with a certain delay after the direct transmission. Hence, it can be expected that the measuring signal following a direct path (i.e. without reflections) and the reflections following a longer path are separated in time. Time-gating technique can allow that only the received signal without reflections can be considered for measuring at least one difference between the transmitted and received electromagnetic waves.

In some embodiments, the separation of the reflections from the measuring signal can be achieved using a gate (such as an electronic switch), which can be activated (i.e. allowing passage) during the interval when signal from the direct path arrives at the at least one receiving antenna until the first reflections arrive at the receiving antenna. Thus, when the reflections arrive at the receiver, the gate can be positioned in an open position, hence not allowing passage of the signal that can be generated by the reflections at the receiving antennas. Thus, only the measuring signal is considered for measurements.

Alternatively or additionally, the whole received signal (including reflections) can be measured. As a result, multiple peaks (or local maximums) can be measured or observed, wherein one of them corresponds to the direct path signal (i.e. shortest path signal) while others can correspond to reflections, diffractions and/or noise. Based on the rationale that, the direct path is shorter than the path of reflections, the received signal with the shortest path (i.e. that arrives earlier) corresponds to the direct path signal. Thus, considering only the peak with the shortest path (e.g. the first measured peak above a predefined threshold) the direct path signal can be considered only and the effects from the reflections can be avoided. However, this may require that a suitable measurement bandwidth, while measuring the received signal, is used. That is, if a small measurement bandwidth is chosen, then it can be hard to differentiate between the direct path signal and reflections. Thus, the measured value of the peak power can be influenced by the reflections. On the other hand, if measurement bandwidth is high, then a better separation between the reflections and the direct path signal can be expected, which can result in a more accurate matching between the maximum received power and the power of the direct path signal.

As discussed in the above paragraph, it can be advantageous to use a high measurement bandwidth for performing time-gated measurements. However, during a time-gated measurement, as discussed above, the measurement is averaged over the measurement bandwidth. In some instances, this effect may not be advantageous, as it can be preferred to perform the measurements in the operating frequency range of the radar (which will be covered by the radome).

In the above, only some exemplary methods (time-gating and electronic switch) of separating the direct path signal from reflection are discussed. It general, other methods can be used too, without changing the core of the invention.

In a third embodiment, the use of the system according to any of the preceding system embodiments and the method according to any of the preceding method embodiments to measure the effects of a radar cover on electromagnetic waves traversing through the radar cover and wherein the radar cover is intended for covering at least one radar, is disclosed.

In a fourth embodiment, the use of the system according to any of the preceding system embodiments and the method according to any of the preceding method embodiments to measure the effects of a radar cover on electromagnetic waves traversing through the radar cover and wherein the radar cover is intended for covering at least one radar used in a vehicle, is disclosed.

In a fifth embodiment, the use of the system according to any of the preceding system embodiments and the method according to any of the preceding method embodiments during the production of a radar cover or system comprising the radar cover, is disclosed.

In a sixth embodiment a production system comprising the radome measuring system according to any of the radome measuring system embodiments discussed above is disclosed. The production system can be a manufacturing system, production line, and/or assembling system and can comprise in one of the production stages the radome measuring system. The production system can be configured for production of radomes and/or products comprising at least one radome and for testing the radome (i.e. carrying a radome measurement).

In some embodiments the production system can be configured to manufacture radomes and test at least one of the produced radomes using the radome measuring system. That is, the production system can produce or manufacture at least one radome and can measure the effect that the radome can have on electromagnetic waves traversing through it, using the radome measuring system.

In some embodiments, wherein the production system can be configured to produce vehicles and wherein at least one of the produced vehicles can comprise a radar cover and the radar cover can be tested using the radome measuring system. For example, in a vehicle it can be advantageous or desirable to hide or position a radar behind a structure of a vehicle, such as, the bumpers of the car, the emblem, etc. Knowing the effect that the radar cover (e.g. bumper, emblem) can have on the signals transmitted and/or received by the radar being covered, can increase the accuracy of the radars. Thus, the production system can use the radome measuring system to measure the effect of the radar covers of the car (e.g. bumper, emblem) on the signal that is transmitted and received by the radar being covered.

In some embodiments of the production system, the radome measuring system can test (or measure) the radome using the method according to the method embodiments discussed above.

In some embodiment, the radome measuring system can be used for research and development purposes. For example, for testing new materials, structures and/or shapes of implementing radar covers. In such embodiments, the radome measuring system allows for the testing of radomes (or other structures intended to be used as radar covers) during development.

In some embodiments, the radome measuring system can also be used for radome inspection purposes. That is, the radome measuring system can be used (e.g. by a respective authority) for testing or checking if a radome (or other structures used as radar covers) fulfill certain requirements (e.g. amount of radar signal attenuation they cause).

In some embodiments, the radome measuring system can be used in repair shops that repair radomes and/or structures used as radomes. After repairment or replacement of a damaged radome. it may be advantageous to test the repaired or the new radome and to measure the effect that it may have on the radar signals.

The present invention also relates to the following numbered embodiments.

Numbered Embodiments

Below, system embodiments will be discussed. These embodiments are abbreviated by the letter "S" followed by a number. Whenever reference is herein made to "system embodiments", these embodiments are meant.

S1. Radome measuring system configured to perform a radome measurement comprising:
at least one transmission antenna (10T), configured for emitting electromagnetic waves; and
at least one receiving antenna (10R), configured for receiving electromagnetic waves; and
a measuring device (14), configured to measure at least one difference between the transmitted and received electromagnetic waves for inferring a feature of a radome (15) positioned between the at least one transmission antenna (10T) and the at least one receiving antenna (10R).

S2. Radome measuring system according to of the preceding embodiment, wherein the electromagnetic waves transmitted by the at least one transmission antenna (10T) traverse at least a section of the radome (15).

S3. Radome measuring system according to any of the preceding embodiments, wherein the system is configured to measure at least one of:
attenuation of an electromagnetic wave traversing through the radome (15),
reflection of electromagnetic waves caused by the radome (15), deflection of the main beam of the transmitter antenna (10T), increasing of the beam width of the transmission antenna (10T), extension of sidelobes of the transmission antenna (10T), the scattering parameters, or S-parameters, of the transmission of electromagnetic waves from the transmission antenna (10T) to the receiver antenna (10R).

S4. Radome measuring system according to any of the preceding embodiments, wherein the at least one transmission antenna (10T) and the at least one receiving antenna (10R) are aligned, such that, the main lobe of the at least one transmission antenna (10T) and the main lobe of the at least one receiving antenna (10R) intersect.

S5. Radome measuring system according to any of the preceding embodiments, wherein the transmission antenna (10T) is configured for emitting or radiating electromagnetic waves with a certain frequency, such as, at least 20 GHz and at most 130 GHz, preferably, at least 70 GHz and at most 90 GHz.

S6. Radome measuring system according to any of the preceding embodiments, wherein the receiving antenna (10T) is configured for receiving electromagnetic waves with a certain frequency, such as, at least 20 GHz and at most 130 GHz, preferably, at least 70 GHz and at most 90 GHz.

S7. Radome measuring system according to any of the preceding embodiments, wherein the incidence angle of the electromagnetic waves transmitted by the transmission antenna (10T) is between 20° to 160°, such as, 90°.

S8. Radome measuring system according to any of the preceding embodiments, wherein the measuring device (14) is connected to the at least transmission antenna (10T) and to the at least one receiving antenna (10R) by a respective connector (142), and wherein the connector (142) comprise any of the at least one of:

electrical conductors, waveguides.

S9. Radome measuring system according to any of the preceding embodiments, wherein the radome measuring system comprises at least one frequency converter, such as:

at least one frequency up-converter between the measuring device and the transmission antenna, configured to translate a signal from the measuring device to a higher frequency band before providing it to the at least one transmission antenna and at least one frequency down-converter between the measuring device and the at least one receiving antenna, configured to translate the signal received from the receiving antenna to a lower frequency band before providing it to the measuring device.

S10. Radome measuring system according to any of the preceding embodiments, wherein the system can comprise at least one reflector (18) and wherein the at least one reflector can be positioned between the transmission antenna (10T) and the radome (15) and/or the receiving antenna (10R) and the radome (15).

S11. Radome measuring system according to the preceding embodiments, wherein the at least one reflector (18) is positioned inclined, with an inclination angle between 30° to 80° or between 100° to 150°.

S12. Radome measuring system according to any of the preceding system embodiments, wherein the at least one transmission antenna (10T) is mounted on at least one transmitter mount (11T) and the at least one receiving antenna (10R) is mounted on at least one receiver mount (11R), and wherein the transmitter mount (11T) and receiver mount (11R) are configured for mounting and supporting at least one antenna (10).

S13. Radome measuring system according to any of the preceding embodiments, further comprising a clamp structure (20), the clamp structure (20) comprising:

a transmitter mount of the clamp (24T) configured for mounting at least one transmission antenna (10T) and a receiver mount of the clamp (24R) configured for mounting at least one receiver antenna (10R) and base frame (22) wherein the transmitter mount of the clamp (24T) and receiver mount of the clamp (24R) are attached such that a substantially U-shaped structure of the clamp (20) is created.

S14. Radome measuring system according to the 2 preceding embodiments, wherein the clamp structure (20) is formed by attaching the transmitter mount (11T) and receiver mount (11R) to the base frame (22).

S15. Radome measuring system according to any of the 2 preceding embodiments, wherein the clamp structure (20) is formed as a single part—i.e. without mounting or assembling or attaching smaller parts together.

S16. Radome measuring system according to any of the 3 preceding embodiments and with the features of embodiment S10, wherein the at least one reflector (18) is attached to the clamp structure (20).

S17. Radome measuring system according to any of the preceding embodiments, further comprising at least one positioning apparatus (30), said positioning apparatus (30) configured to move the at least one transmission antenna (10T) and the at least one receiving antenna (10R).

S18. Radome measuring system according to the preceding embodiment and with the features of embodiment S13, wherein the clamp structure (20) is attached to the positioning apparatus (30) and the positioning apparatus (30) can move the clamp structure (20).

S19. Radome measuring system according to any of the preceding 2 embodiments, wherein the positioning apparatus (30) is a robotic arm (30) and wherein the robotic arm (30) comprises a:

a robotic arm base (31) configured to support the robotic arm (30) and a first prolonged member (32) attached on one of its ends with the robotic arm base (31) and on the other end with a second prolonged member (34) and wherein the second prolonged member (34) can be configured to support the at least one transmission antenna (10T) and the at least one receiving antenna (10R) and/or respective mounting structures of the at least one transmission antenna (10T) and the at least one receiving antenna (10R).

S20. Radome measuring system according to the preceding embodiment, wherein the robotic arm (30) is configured to allow at least one of:

relative motion between the robotic arm base (31) and first prolonged member (32), relative motion between the first prolonged member (32) and second prolonged member (34).

S21. Radome measuring system according to any of the 4 preceding embodiments and with the features of embodiment S18, wherein the joint between the clamp structure (20) and the positioning apparatus (30) is configured to provide rotation of the clamp structure (20).

S22. Radome measuring system according to any of the preceding embodiments, wherein the system further comprises a radome handling apparatus (40).

S23. Radome measuring system according to any of the preceding embodiments, wherein the radome handling system is configured to move the radome (15).

S24. Radome measuring system according to any of the preceding embodiments, wherein the distance between the at least one transmission antenna (10T) and the at least one receiving antenna (10R) is between 10 cm to 1 m.

S25. Radome measuring system according to any of the preceding embodiments, wherein the at least one transmission antenna (10T) and the at least one receiving antenna (10R) are configured as transceiver antennas (10), that is, are configured to transmit and receive electromagnetic waves.

S26. Radome measuring system according to any of the preceding embodiments, wherein the system can comprise 1 to 100 transmission antennas (10T) and 1 to 100 receiving antennas (10R).

S27. Radome measuring system according to any of the preceding embodiments and with the features of embodiment S4, wherein a maximum misalignment of 0.05 mm, preferably 0.1 mm, even more preferably 1 mm can be tolerated between the at least one transmitter antenna (10T) and the at least one receiver antenna (10R).

S28. Radome measuring system according to any of the preceding embodiments, further comprising a first robotic arm configured to support and handle at least one transmission antenna (10T) and a second robotic arm configured to support and handle at least one receiving antenna (10R).

S29. Radome measuring system according to the preceding embodiment and with the features of embodiment S4, wherein the alignment between the at least one transmission antenna (10T) and the at least one receiving antenna (10R) is facilitated by a calibration step between the first robotic arm and the second robotic arm.

Below, method embodiments will be discussed. These embodiments are abbreviated by the letter "M" followed by a number. Whenever reference is herein made to "method embodiments", these embodiments are meant.

M1. A method of measuring the effects of a radome on electromagnetic waves traversing through the radome, using the radome measuring system according to any of preceding system embodiments, the method comprising the steps of:
  (a) providing a radome (15) between at least one transmission antenna (10T) and at least one receiving antenna (10R);
  (b) triggering the at least one transmission antenna (10T) to radiate electromagnetic waves;
  (c) receiving the transmitted electromagnetic waves in step (b) by the at least one receiving antenna (10R);
  (d) measuring at least one difference between the transmitted and received electromagnetic waves; and
  (e) inferring a feature of the radome (15) based on the at least one difference between the transmitted and received electromagnetic waves.

Throughout the text, steps (b), (c) and (d) can be referred as a radome measurement.

M2. A method according to the preceding embodiment, further comprising performing referencing with an empty measurement by performing steps (b), (c) and (d) before providing the radome (15) between the at least one transmission antenna (10T) and at least one receiving antenna (10R).

M3. A method according to any of the preceding embodiments, the method comprising performing steps (b), (c) and (d) at least one time, such as, 1 to 100 times, before performing step (e).

M4. A method according to any of the preceding embodiments, the method further comprising step:
  (f) changing the relative position between the radome (15) and the at least one transmission antenna (10T).

M5. A method according to the preceding embodiment, wherein steps (b), (c), (d) and (f) are performed at least one time, such as, 1 to 100 times, before performing step (e).

M6. A method according to embodiment M4, wherein steps (b), (c), (d), (e) and (f) are performed at least one time, such as, 1 to 100 times.

M7. A method according to any of the preceding embodiments, wherein the method further comprises performing time-gating before step (d), such that, interference of the received signal considered in step (d) is minimized.

Below, use embodiments will be discussed. These embodiments are abbreviated by the letter "U" followed by a number. Whenever reference is herein made to "use embodiments", these embodiments are meant.

U1. Use of the system according to any of the preceding system embodiments and the method according to any of the preceding method embodiments to measure the effects of a radar cover on electromagnetic waves traversing through the radar cover and wherein the radar cover is intended for covering at least one radar.

U2. Use of the system according to any of the preceding system embodiments and the method according to any of the preceding method embodiments to measure the effects of a radar cover on electromagnetic waves traversing through the radar cover and wherein the radar cover is intended for covering at least one radar used in a vehicle.

U3. Use of the system according to any of the preceding system embodiments and the method according to any of the preceding method embodiments during the production of a radar cover or system comprising the radar cover.

Below, production system embodiments will be discussed. These embodiments are abbreviated by the letter "P" followed by a number. Whenever reference is herein made to "production system embodiments", these embodiments are meant.

P1. A production system comprising a radome measuring system according to any of the preceding embodiments S1 to S29.

P2. A production system according to the preceding embodiment, wherein the production system is configured to manufacture radomes and test at least one of the produced radomes using the radome measuring system.

P3. A production system according to any of the 3 preceding embodiments, wherein the production system is configured to produce vehicles and wherein at least one of the produced vehicles comprises a radar cover and wherein the radar cover is tested using the radome measuring system.

P4. A production system according to any of the 4 preceding embodiments, wherein the radome measuring system tests the radome using the method according to the method embodiments M1 to M7.

BRIEF DESCRIPTION OF THE DRAWINGS

FIGS. 3A and 3B depict a schematic of a radome measuring system comprising at least one positioning apparatus and a clamp structure;

DETAILED DESCRIPTION OF THE DRAWINGS

In the following, exemplary embodiments of the invention will be described, referring to the figures. These examples are provided to contribute to a further understanding of the invention, without limiting its scope.

In the following description, a series of features and/or steps are described. The skilled person will appreciate that unless required by the context, the order of features and steps is not critical for the resulting configuration and its effect. Further, it will be apparent to the skilled person that irrespective of the order of features and steps, time delays between steps can be present between some or all of the described steps.

Throughout the description, the process of measuring a radome is referred as radome measurement for the sake of brevity. It will be understood that a radome measurement can comprise measuring electromagnetic, transmission and/or reflection properties of the radome. For example, during a radome measurement the following effects caused by the radome on the antenna (or radar or sensor) it is covering, can be measured: attenuation and/or phase (e.g. a complex measurement) of an electromagnetic wave traversing through the radome, reflection of electromagnetic waves hitting the radome, deflection of the main beam of the antenna, increasing of the beam width of the antenna, extension of sidelobes of the antenna, etc. Alternatively or additionally, during a radome measurement the scattering parameters, or S-parameters, can be measured and/or calculated and/or inferred.

Alternatively or additionally the radome measurement can comprise measuring the phase of the electromagnetic wave traversing through the radome on multiple points of the radome. That is, electromagnetic waves are transmitted such that they can traverse different measuring points (or areas) of the radome and the phase of the electromagnetic waves can be measured. Further, the consistency (or stability) of the measured phases of the electromagnetic waves can be checked. That is, it can be measured (or calculated or observed) if and/or how much the measured phases of the electromagnetic waves traversing different parts or measuring points of the radome differ from each other. The phase measurements, particularly phase measurements of electromagnetic waves traversing through different measuring points of the radome, can facilitate inferring the effect that the radome can have on angle measurements (i.e. detection of angle of arrival) of the radar sensors intended to be covered by the radome. For example, if the phase measurements imply that the phase is stable from point to point of the radome or that the phase changes on different measuring points of the radome are less than a threshold value, then it can be inferred that the effect of the radome on the detection of the direction of arrival by the radar sensor is tolerable.

Figure 1A:
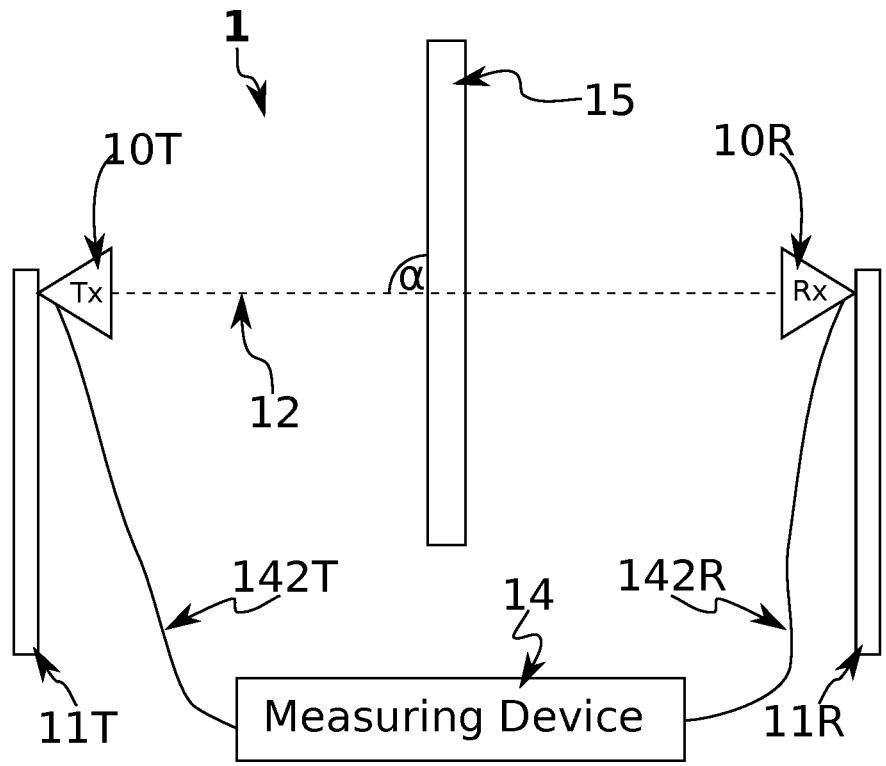
FIGS. 1A to 1D depict a schematic of a radome measuring system according to an embodiment of the present invention.

FIG. 1A depicts a first radome measuring system 1 according to an embodiment of the present invention. The radome measuring system 1 is configured for performing radome measurements.

The radome measuring system 1 can comprise two antennas 10, more particularly, a transmission antenna 10T (also referred as transmitter 10T) and a receiving antenna 10R (also referred as receiver 10R). It will be understood that the radome measuring system 1 can comprise more than two antennas 10 (e.g. see FIG. 5).

The transmission antenna 10T can be configured for emitting or radiating electromagnetic waves with a certain frequency, such as, at least 20 GHz and at most 130 GHz, preferably at least 70 GHz and at most 90 GHz. The transmission antenna 10T can be configured to emit electromagnetic radiation in the direction depicted by the alignment line 12 (also referred as transmission path 12). That is, the main lobe of the antenna 10T is directed according to the transmission path 12. It should be understood that the transmission path 12 (depicted with dashed lines) does not represent any structure, but is provided to illustrate the direction of transmission of the transmission antenna 10T. The transmission antenna 10T can be configured to transmit electromagnetic waves with a power of at least 1 microwatt (i.e. −30 dBm) and at most 1 watt (i.e. 30 dBm).

The receiving antenna 10R can be configured for receiving electromagnetic signals with a certain frequency, such as, at least 20 GHz and at most 130 GHz, preferably at least 70 GHz and at most 90 GHz. The receiving antenna 10R can be configured to receive electromagnetic waves arriving from the direction depicted by the alignment line 12 (also referred as transmission path 12). That is, the main lobe of the antenna 10R is directed according to the transmission path 12.

In a preferred embodiment, the antennas 10, particularly the transmission antenna 10T, while measuring a radome 15 can be configured to match the properties of the radar sensor for which the radome 15 is intended to be used. The properties may include: operational frequency range, field of view (or angle of coverage), polarization, etc.

The transmission antenna 10T and receiving antenna 10R can be aligned with each other according to the alignment line 12, as depicted in FIG. 1A. That is, the transmission antenna 10T and receiving antenna 10R can be arranged, such that, the main lobe of the transmission antenna 10T and the main lobe of the receiving antenna 10R can intersect with each-other. This arrangement can allow the electromagnetic waves transmitted from the transmission antenna 10T to be received by the receiving antenna 10R.

The alignment of the antennas 10 as described and illustrated in FIG. 1A can be facilitated by the antenna mounts 11, more particularly, by the transmitter mount 11T and receiver mount 11R. The antenna mounts 11 can be structured, such that, at least one antenna 10 can be mounted therein and the antenna mount 11 can support the respective mounted antenna 10. Furthermore, a pair of antenna mounts 11 comprising a transmitter antenna mount 11T (or transmitter mount 11T) and receiver antenna mount 11R (or receiver mount 11R) can be configured such that, a line-of-sight or direct path without reflection or shortest path reception at the receiving antenna 10R mounted on the receiver mount 11R of the electromagnetic waves emitted by the transmitter antenna 10T mounted on the transmitter mount 11T can be achieved.

The transmission path 12 can be intercepted by an object under test 15. The object under test 15 can be a radome 15 or part of a radome 15 or a representation of a radome 15 (e.g. the representation to be tested comprises the same material and/or structure as the radome). For brevity, the object under test 15 will be referred as radome 15. Thus, the radome 15 can be placed in the space between the transmission antenna 10T and the receiving antenna 10R. Hence, the electromagnetic waves emitted by the transmission antenna 10T, can contact the radome 15 and part of the emitted waves can traverse the radome 15 and can be received by the receiving antenna 10R.

The radome 15 can be put between the antennas 10 in different positions. Preferably the position in which the radome 15 is positioned between the antennas 10 corresponds to the position of the radome under normal use. Such a positioning of the radome 15 during the radome measurements can allow the prediction of the effect of the radome 15 on the sensing of a radar sensor that the radome 15 will cover during use.

Usually a radome 15 comprises a flat (or a not too strongly curved) structure—i.e. one of the dimensions is significantly lower than the two other dimensions. For example, the radome 15 can be thin, such that, to minimize the path that the electromagnetic waves have to traverse through the radome 15. Thus, the radome 15 can be placed between the antennas 10, such that the electromagnetic waves emitted by the transmit antennas traverse a minimum distance inside the radome 15. FIG. 1A depicts a preferable position of the radome 15 between the antennas 10, wherein the smallest dimension of the radome is depicted and can be traversed by the electromagnetic waves emitted by the transmission antenna 10T (the other two dimensions are not shown). However, it should be understood that, generally, the radome 15 can be positioned and tested in any position and orientation between the antennas 10.

Further, the radome 15 can be put with a certain inclination between antennas 10. In one hand the inclination of the radome 15 can be advantageous as it can direct reflections away from the antennas 10 (i.e. in a different direction from the transmission line 12), thus avoiding the back-and-forth bouncing of the reflections between the radome 15 and the antennas 10. That is, the angle that the reflected electromagnetic waves and the incident electromagnetic wave create with the normal to the surface of incidence of the radome are equal. When the normal to the surface of incidence of the radome 15 is parallel or coincident to the transmission line 12 (as depicted in FIG. 1A, as the angle α is) 90°, the reflections created by the radome 15 are more directed towards the transmission antenna 10T and receiving antenna 10R. However, providing the radome 15 inclined, that is, a certain angle different from 0° between the normal to the surface of the radome 15 and the transmission line 12 can be created, less reflections created by the radome 15 can be directed towards the transmission antenna 10T and the receiving antenna 10R.

The radome 15 can be provided inclined in the vertical or horizontal direction or a combination of both (i.e. diagonal inclination). For example, in FIG. 1A, the vertical inclination of the radome 15 is illustrated by the angle α, created by the transmission line 12 and the surface of the radome 15 facing the transmitter antenna 10T, wherein the angle α is provided 90°. The inclination of the radome 15 in any direction can be up to ±70° (i.e. up to 70° in both rotation directions: clockwise and counter-clockwise). In a preferred embodiment, the radome 15 can be provided inclined in the vertical direction up to ±15° (i.e. the angle α can be between 75° and 105°) and/or inclined in the horizontal direction up to ±70°, wherein inclinations in the horizontal and vertical directions can also be combined. Note that, in this context, the vertical and the horizontal direction are defined as observed by the antenna 10T.

Further still, the radome 15 can also be rotated with respect to a rotational axis parallel to the transmission line 12, such as, an axis coincident to the transmission line 12.

Put simply, the positioning of the radome 15 can comprise translational shifts and/or inclinations and/or rotations of the radome 15 in any direction. The positioning of the radome 15 can facilitate matching the relative position between the radome 15 and the transmission antenna 10T during a radome measurement with the relative position of the radome 15 with the covered radar sensor during normal use of the radar sensor and radome. This can allow a better prediction of the effect of the radome 15 on the sensing of the radar sensor covered by the radome 15. The positioning of the radome 15 can also facilitate measuring specific parts or sections of the radome 15 positioned in specific orientations or positions.

In a preferred embodiment, the transmission antenna 10T and receiving antenna 10R ca be horn antennas. The horn antennas are advantageous due to their substantial directivity which allows to direct the transmitted waves toward a preferred direction, such as the transmission path 12. Thus, the transmitter horn antenna 10T can be used to emit electromagnetic waves toward the radome 15 or toward a part of the radome 15 (e.g. the smallest part of the radome 15 that can be measured without changing the relative position between the antennas 10 and the radome 15, see FIG. 7A). Further, a horn antenna is also advantageous as it allows a gradual transition structure, realizing impedance matching with open air hence allowing for efficient radiation of waves.

Furthermore, horn antennas can emit linearly polarized electromagnetic waves. It can be advantageous to match the polarization of the transmission antenna 10T and receiving antenna 10R with the polarization of the radar that will be covered by the radome 15 under test, as more accurate results can be obtained (the more similar the test conditions to the real conditions are the more accurate results can be expected). A radar can be configured to transmit electromagnetic waves with different polarizations, such as, linear (horizontal or vertical), circular (clockwise or anti-clockwise), epileptic, etc. Usually radar sensors are configured to emit electromagnetic waves with linear polarization. Thus, horn antennas can be preferable to use for testing radomes of radars that emit linearly polarized electromagnetic waves. Nevertheless, the transmission antenna 10T and receiving antenna 10R, can also be configured for emitting and/or receiving electromagnetic waves with other polarizations, such as, circular or epileptic polarization.

Additionally, the radome measuring system 1 can comprise a measuring device 14. The measuring device 14 can be connected with the transmission antenna 10T by a transmitter connector 142T and with the receiving antenna 10R by a receiver connector 142R. The measuring device 14 can trigger the transmission antenna 10T to emit an electromagnetic wave with a certain pattern in time and frequency. For example, the measuring device 14 can trigger the transmission antenna 10T to emit pulses of electromagnetic waves with a certain bandwidth centered around a certain frequency. As it can be understood, the measuring device 14 can trigger the transmission antenna 10T to emit electromagnetic waves within the range of frequencies and bandwidths supported by the transmission antenna 10T (i.e. based on the geometry or physical structure of the transmission antenna 10T a certain range of frequencies can be transmitted efficiently). The measuring device can trigger the at least one transmission antenna to transmit single tones, wherein each tone is transmitted at a time and with a frequency within a certain frequency range (e.g. corresponding to the bandwidth that the radome should be measured). Alternatively, when multiple measurements can be performed simultaneously (e.g. multiple transmission and receiving antennas are provided, see FIG. 5) the measuring device can trigger each transmission antenna to transmit a unique tone. Thus, multiple tones can be transmitted at a time. Alternatively, the measuring signal can trigger the at least one transmission antenna 10T to transmit a modulated signal (i.e. a composed signal of multiple single tones)—which can allow multiple tones to be transmitted simultaneously.

Similarly, the measuring device 14 can receive signals provided by the receiving antenna 10R. The measuring device 14 can be configured to identify signal reception by the receiving antenna 10R (or alternatively identify when the receiving antenna 10R is simply "listening" to background noise). When a signal reception is identified, the measuring device 14 can use information regarding the transmitted signal and information regarding the receiving signal to measure dielectric properties of the medium(s) between the transmission antenna 10T and receiving antenna 10R.

The differentiation of signal reception (i.e. reception of the signal that is transmitted by the transmission antenna 10T) from background noise (and/or interference) at the receiving antenna 10R can be done using power squelching—i.e. only signals above a certain power level can be considered as signal reception, while the rest is considered as background noise.

As discussed, during the transmission of a signal from the transmission antenna 10T to the receiving antenna 10R, reflections and/or diffractions can be created by the surfaces (and/or edges) of the radome 15 and the antennas 10. As it can be understood, it is preferable that only the direct path signal that is generated by the transmission antenna 10T, transmitted through the radome 15 and received by the receiving antenna 10R, is measured and/or analyzed by the measuring device 14. However, reflections and/or diffractions can be received by the receiving antenna 10R and can corrupt the measurements—hence lowering the accuracy of the measurements. Thus, it can be advantageous to identify and suppress or not consider reflections (or at least part of the reflections).

Reflections (and diffractions) follow a longer path compared to the direct path signal that is transmitted from the transmission antenna 10T, through the radome 15 and to the receiving antenna 10R. Hence, it can be expected that the transmitted signal is received at the receiving antenna 10R before the reflections and diffractions. In other words, the transmitted signal and the reflections are separated (or multiplexed) in the time domain. This rationale can be used for separating the direct path signal from the reflections and/or diffractions.

In some embodiments, the separation of the direct path signal (or shortest path signal) from the reflections and/or diffractions can be achieved through the use of a gate, such as, an electronic-switch (not shown in any of the figures). The switch can be provided between the receiving antenna 10R and the measuring device 14 and can be activated only during the period (or at time slots) during which the direct path signal is not interfered by reflections and/or diffractions (i.e. the reflections/diffractions have not reached the receiving antenna 10R yet). Thus, only signal that is not interfered by reflections and/or diffractions, which corresponds to direct path signal, can be considered for collecting data for measuring the signal. This may provide better results as the direct path signal traverses only through the radome while being transmitted from the at least one transmission antenna 10T to the at least one receiving antenna 10R and thus is affected only by the radome. For example, if the measuring device 14 is configured to measure attenuation of the signal caused only by the radome 15, a measurement as discussed above, using the electronic-switch, can provide better results for the following reasons (however, not limited to only these reasons): attenuation of the reflections, which is generally higher due to longer path and multiple incidences with the surfaces of the antennas 10 and radome 15 is not considered, as well as the interference (constructive or destructive) between the reflections and the transmitted signal.

Alternatively or additionally, the separation of the reflections and/or diffractions from the direct path signal can be achieved through the time-gating technique (also referred as time-gated measurements). That is, the signal can be measured in time domain (e.g. using an oscilloscope device) or in frequency domain (e.g. using a network analyzer). For example, the power and/or phase of the signal can be measured, among others, in the time and/or frequency domain. The measurement can be done over a predefined bandwidth, either by transmitting multiple single tones within the bandwidth or by modulating a signal such that it can comprise multiple tones within the predefined bandwidth. The predefined bandwidth can correspond to the operating bandwidth of the radar which will be covered by the radome 15 under test. For example, the bandwidth of the measuring signal can be between 20 to 130 GHz, preferably between 70 to 90 GHz.

As it can be understood, initially the direct path signal will be measured (as it arrives earlier), then the measurements can be affected by reflections and diffractions. Further, the direct path signal can be expected to be received with a higher power compared to reflections. Based on these rationales, the direct path signal can be distinguished or separated from the reflections (and/or diffractions). For example, only the first peak received power can be considered, which is expected to correspond to the received power of the direct path signal (i.e. shortest path signal).

The transmitter connector 142T and receiver connector 142R can be electrical conductors, such as, wires—e.g. coaxial cables. In such embodiments, the measuring device 14 can trigger the antenna 10T by sending an electrical signal through the conductor 142T and the transmitter antenna 10T converts the electrical signals into electromagnetic radiation. The receiving antenna 10R, converts electromagnetic radiation into electrical signals and transmits them to the measuring device 14 through the conductor 142R.

In another embodiment, the transmitter connector 142T and receiver connector 142R can be waveguides 142. In such embodiments, the measuring device 14 can be configured to trigger the transmission antenna 10T by generating electromagnetic waves and transmitting those through the waveguide 142T to the transmitter antenna 10T. The transmitter antenna 10T provides the interface between the waveguide 142T and open-air for an efficient transmission of the waves. The receiving antenna 10R receives electromagnetic radiation and transmits it through the waveguide 142R to the measuring device 14.

In some embodiments, the received signal can be provided to the measuring signal in the same frequency range as transmitted from the transmission antenna 10T and received by the receiving antenna 10R, i.e. the RF signal is directly distributed to the measuring device 14.

In another embodiment, a frequency converter can be used at the transmitter antenna 10T and receiving antenna 10R. More particularly, an up-converter can be used between the measuring device 14 and the transmitter antenna 10T and a down-converter can be used between the receiving antenna 10R and the measuring device 14. Thus, the measuring device 14 can operate at an intermediate frequency IF (e.g. 1-6 GHz) or at baseband (0-3 GHz), while the antennas 10 can transmit and/or receive RF signal at higher frequencies (i.e. RF range, e.g. 70-90 GHz). This can be advantageous as the measuring device 14 can be configured to operate at a certain low frequency range (e.g. IF range or baseband) independent of the RF range of the signals transmitted between the transmitting antenna 10T and receiving antenna 10R.

Thus, the measuring device can operate at an intermediate frequency (IF), e.g. 1-6 GHz, or at baseband (e.g. 0-3 GHz), while the antennas can transmit and/or receive RF signal at higher frequencies (i.e. RF range, e.g. 70-90 GHz).

Figure 1B:
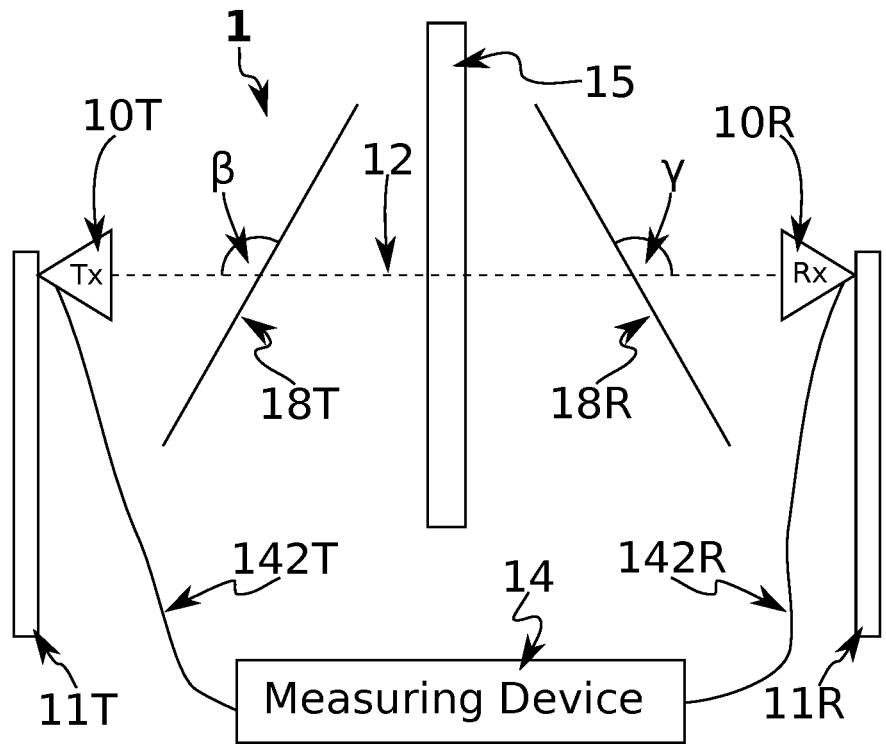

FIG. 1B depicts another embodiment of the radome measuring system 1. In FIG. 1B (and throughout the description of the drawings), like reference signs denote like structures. Furthermore, the features and characteristics described above in conjunction with FIG. 1A are also used in the embodiment depicted in FIG. 1B. For sake of brevity of description, in the below, only additional features present in the embodiment of the radome measuring system 1 depicted in FIG. 1B are discussed (the same rationale also applies to the description of the additional figures).

In the embodiment of FIG. 1B, additionally the wave reflectors 18 (also referred as reflectors 18) are provided to the radome measuring system 1. The wave reflectors 18 are provided to divert reflections from the radome 15 from reaching the antennas 10 and reflection from the antennas 10 to reach the radome 15. Two reflectors 18 can be provided: a reflector on the transmitter side 18T and a reflector on the receiver side 18R. The reflector on the transmitter side 18T can be placed between the transmission antenna 10T and the radome 15. The reflector on the receiving side 18R can be placed between the radome 15 and the receiving antenna 10R. Thus, the reflectors 18 can avoid reflections of the electromagnetic waves form bouncing back-and-forth between the transmission antenna 10T and radome 15 as well as between the radome 15 and receiver antenna 10R.

In FIG. 1B, the reflectors 18 are provided on the transmitter and receiver side. However, in some embodiments, the reflector 18 (or reflectors 18) can be provided only on one side of the radome 15. That is, in some embodiments only the reflector 18T can be provided on the transmitter side (i.e. between the transmitting antenna 10T and radome 15) and on some other embodiments only the reflector 18R can be provided on the receiver side (i.e. between the receiving antenna 10R and radome 15).

The use of two reflectors 18, on the transmitter and receiver side of the radome 15, can be advantageous as it provides a better removal of reflections as compared to the case when one or no reflectors 18 are used. However, as the measuring signal emitted by the transmission antenna 10T passes through the reflectors 18 before reaching the receiving antenna 10R, a higher attenuation of the measuring signal can be caused if the number of reflectors 18 increases. Thus, it can also be advantageous to use one reflector 18 positioned on the receiver or transmitter side, as less attenuation of the measuring signal can be caused compared to the case when two or more reflectors 18 are used.

To avoid the bouncing of reflections between the antennas 10 and the radome 15, the reflectors can be provided inclined. The inclination angle of the reflector at transmitter side 18T is denoted by the angle β and inclination angle of the reflector at the receiving side 18R is denoted by the angle γ. The inclination angle β and γ can be 100° to 150° or 30° to 80°.

In FIG. 1B only the vertical inclination of the reflectors 18T and 18R is illustrated by angels β and γ respectively. However, in a similar manner, the reflectors 18T and 18R can be also inclined horizontally with a horizontal inclination angle between 100° to 150° or 30° to 80°. The horizontal and vertical inclinations can also be combined, i.e. the reflector 18 is simultaneously inclined in the vertical and horizontal direction. In this context, the vertical and horizontal directions are defined as observed by the transmitting antenna 10T.

In general, the reflector 18 should be configured such that it can comprise some degree of reflectivity (such that it can reflect away the reflections) while at the same time comprising some degree of transmittance (such that the transmitted signal can pass through it, hit the radome 15 and reach the receiving antenna 10R). The reflectors 18 can preferably comprise a plastic material.

Figure 1C:
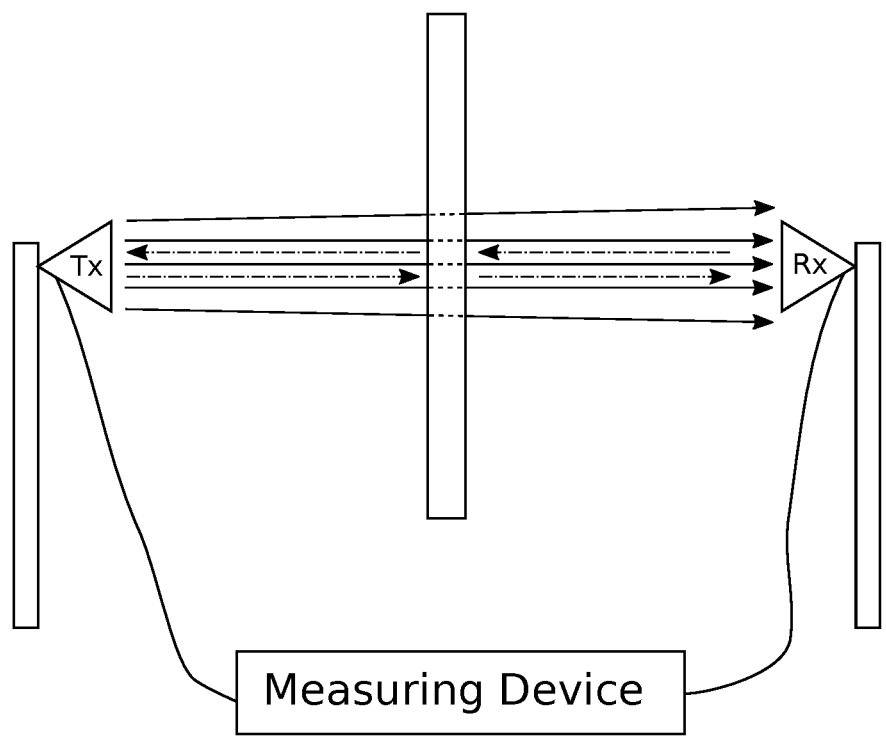
Figure 1D:
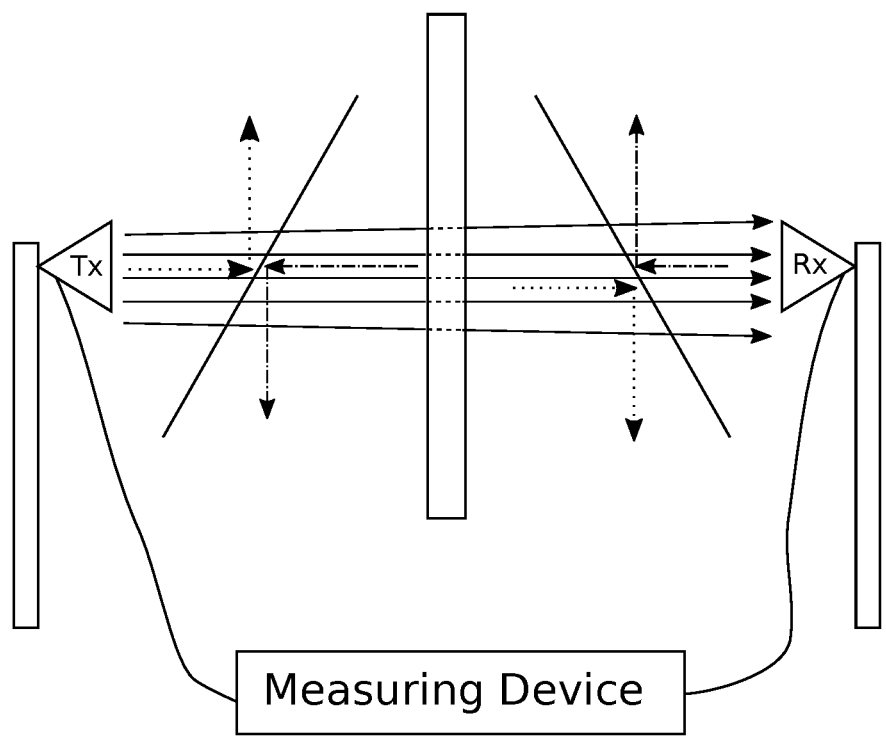

FIGS. 1C and 1D depict the radome measuring system 1 according to embodiments of FIG. 1A and FIG. 1B respectively. Not to overload the drawing, referral numberings and letters of the elements is omitted, as well as the alignment line 12—however reference to FIGS. 1A and 1B should be made for inferring the referral numberings and letters of the depicted elements. FIGS. 1C and 1D illustrate the propagation paths of the electromagnetic waves between the transmission antenna 10T and receiving antenna 10R.

In FIG. 1C the transmitted waves by the transmission antenna 10T are illustrated by the full-line arrows having only the part of the waves that propagates through the radome 15 indicated with dashed lines. Reflections are illustrated by the dotted-dashed line arrows. It should be noted that the number of arrows does not correspond to the number of waves transmitted or reflected—they are provided for illustration purposes only.

As depicted in FIG. 1C, part of the electromagnetic waves emitted by the transmission antenna 10T are directed towards the radome 15, can traverse the radome 15 and be received at the receiving antenna 10R. During the traverse of the radome 15, the electromagnetic waves are affected (e.g. attenuated) by the material of the radome 15.

Furthermore, part of the electromagnetic energy radiated by the transmission antenna 10T, is reflected by (and do not pass through) the radome 15. These reflections can then be directed towards the transmission antenna 10T, which can reflect them back again. Hence, reflection can bounce back-and-forth between the transmission antenna 10T and the radome 15 (as depicted by the dotted-dashed arrows). Such reflections are an unwanted effect, as they can distort the electromagnetic waves emitted by the transmission antenna 10T and thus affect the accuracy of the radome measurement.

Similarly, the electromagnetic waves that reach the receiving antenna 10R can also be reflected, by the surface of the receiving antenna 10R towards the radome 15. Further, the reflections can again be reflected by the surface of the radome 15 towards the receiving antenna 10R hence bouncing back-and-forth between the radome 15 and the receiving antenna 10R. Such reflections are an unwanted effect, as they can distort the electromagnetic waves that reach the receiving antenna 10R and thus affect the accuracy of the radome measurement.

As discussed, reflections can be avoided or reduced using reflectors 18. This is illustrated in FIG. 1D. As it can be seen on FIG. 1D, reflections from the radome 15 that would normally reach the transmission antenna 10T, are reflected away by the reflector at the transmitter side 18T. Similarly, reflections created by the receiving antenna 10R are reflected away by the reflector at the receiver side 18R.

It should be noted that also the electromagnetic waves on the path from transmission antenna 10T to the reflector 18T and from the radome 15 to the reflector 18R can be reflected (depicted by dotted lines reflected upwards). This is an unwanted effect as it contributes on the attenuation of the measuring signal between the transmission antenna 10T and receiving antenna 10R. Thus, the use of reflectors 18 are accompanied by the trade-off between power of the received signal at the receiving antenna 10R and avoidance of reflections.

Figure 2A:
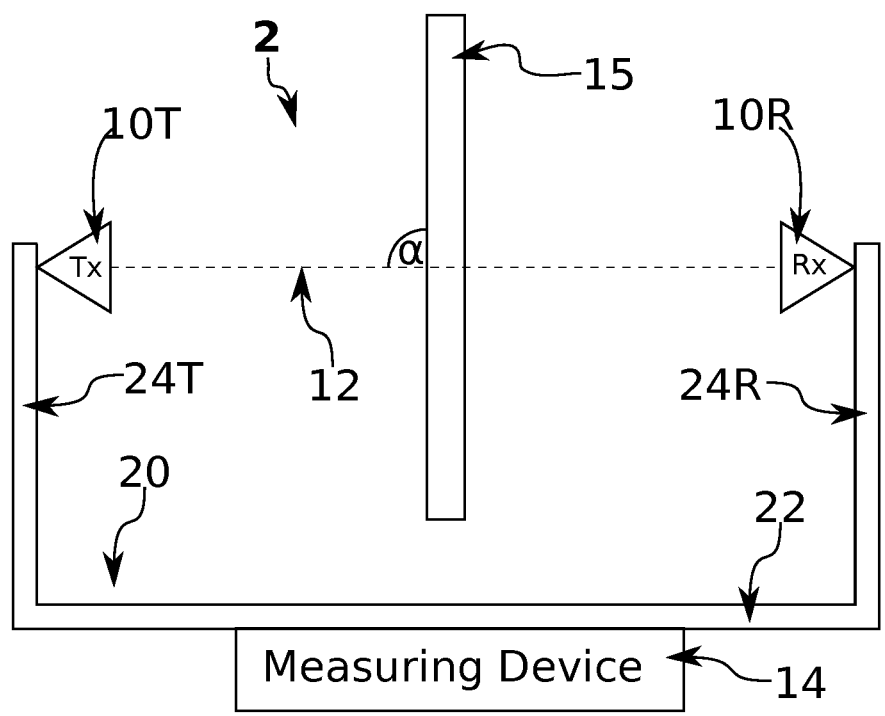
FIGS. 2A and 2B depict a schematic of a radome measuring system comprising a clamp structure.

FIG. 2A depicts a schematic of a second radome measuring system 2, also referred as the radome measuring system with clamp 2 (or for brevity as a radome measuring clamp 2). In addition to the radome measuring system 1 discussed with respect to FIGS. 1A and 1B, the radome measuring clamp 2 can comprise a clamp structure 20 (also referred as a clamp 20). The clamp 20 can comprise a base frame 22. On the base frame 22, two antenna mounts 24 can be attached. More particularly, on one of the ends of the base frame 22, a transmitter mount of the clamp 24T can be attached and on the other end, a receiver mount of the clamp 24R can be attached. Hence, the transmitter mount of the clamp 24T and the receiver mount of the clamp 24R and the base frame 22 can create a U-shaped structure or a "clamp" shaped structure.

In some embodiments, the clamp 20 can be manufactured by attaching or fixating the transmitter mount of the clamp 24T and the receiver mount of the clamp 24R on two opposing sides of the base frame 22. In some other embodiments, the clamp 20 can be created by attaching the antenna mounts 11T, 11R (see FIG. 1A) to opposing sides of the base frame 22. In yet some other embodiments, the clamp 20 can be manufactured as a single part—i.e. without mounting or assembling or attaching smaller parts together to form the clamp 20.

The clamp 20 can provide a stable structure for the antennas 10 to be mounted. As discussed it can be advantageous to have the transmission antenna 10T and the receiving antenna 10R aligned with each-other such that most of the radiated electromagnetic waves emitted by the transmission antenna 10T can be received by the receiving antenna 10R. The shape of the clamp structure 20 can facilitate this alignment. Further, it can be advantageous that the distance between the two antennas 10 to be kept constant, at least during a radome measurement. The clamp structure 20, more particularly the base frame 22, can keep the distance between the transmission antenna 10T and receiving antenna 10R constant.

The clamp structure 20 can also be configured to allow the fixation of the antenna mounts 24T and 24R on different parts of the base frame 22. This can allow the adjustment of the relative position between the two antenna mounts 24T and 24R, such as, the adjustment of the distance between the antenna mounts 24T and 24R. For example, the base frame 22 can comprise multiple fixation positions, wherein the antenna mounts 24T and 24R can be fixed to the base frame 22.

The radome measuring clamp 2 can also comprise the transmitter connector 142 and the receiver connector 142R (see FIG. 1A), which can be provided hidden inside the clamp structure 20.

Figure 2B:
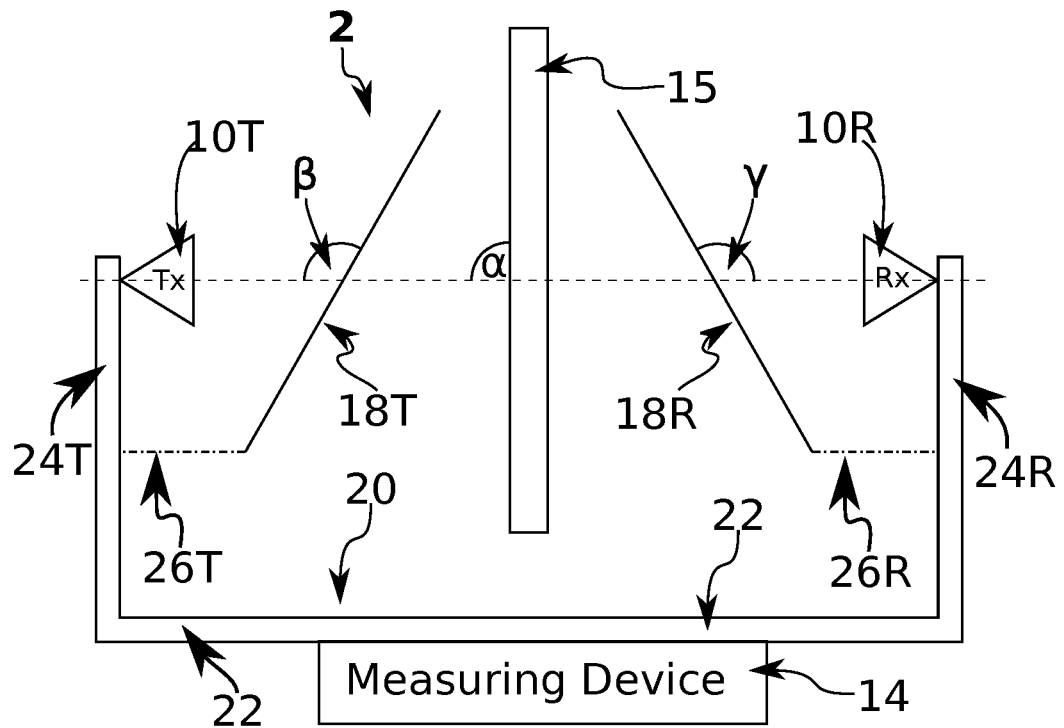

FIG. 2B depicts another embodiment of the radome measuring clamp 2. Additional to the radome measuring clamp 2 depicted in FIG. 2A, the radome measuring clamp 2 of FIG. 2B comprises the reflectors 18 (also discussed in FIG. 1B). The reflectors 18 can be mounted on the clamp structure 20, for example using a reflector mounting structure 26. More particularly, the reflector on the transmitter side 18T can be mounted on the transmitter mount on the clamp 24T using the reflector mounting structure 26T. Similarly, the reflector on the receiver side 18R can be mounted on the receiver mount of the clamp 24R using the reflector mounting structure 26R.

The joint between the reflector mounting structure 26 and the reflector 18 can be a rotational joint (not shown). That is, it can allow the reflector 18 to be rotated with respect to the joint. This can further allow the inclination angle of the reflectors 18 (i.e. β and γ) to be adjusted. The rotation of the reflector 18 with respect to the joint with the reflector mounting structure can either be achieved by exerting a force or torque on the reflector 18 or by a motor (not shown) that can be provided on the joint. The use of a motor to rotate the reflector can be advantageous as it can allow automatic adjustment of the inclination angles β and γ. Alternatively, the joint between the reflector mounting structure 26 and the reflector 18 can be a fixed joint, hence allowing for a fixation of the inclination angle of the reflectors 18 (i.e. β and γ).

In some embodiments, the reflectors 18 can be removable from the structure of the clamp 20. That is the reflector 18 can be detached from and reattached to the respective reflector mounting structure 26 and/or the reflector mounting structure 26 can be detached from and reattached to the clamp 20. Thus, according to these embodiments, the radome measurement can be done with or without the reflectors 18.

Figure 3A:
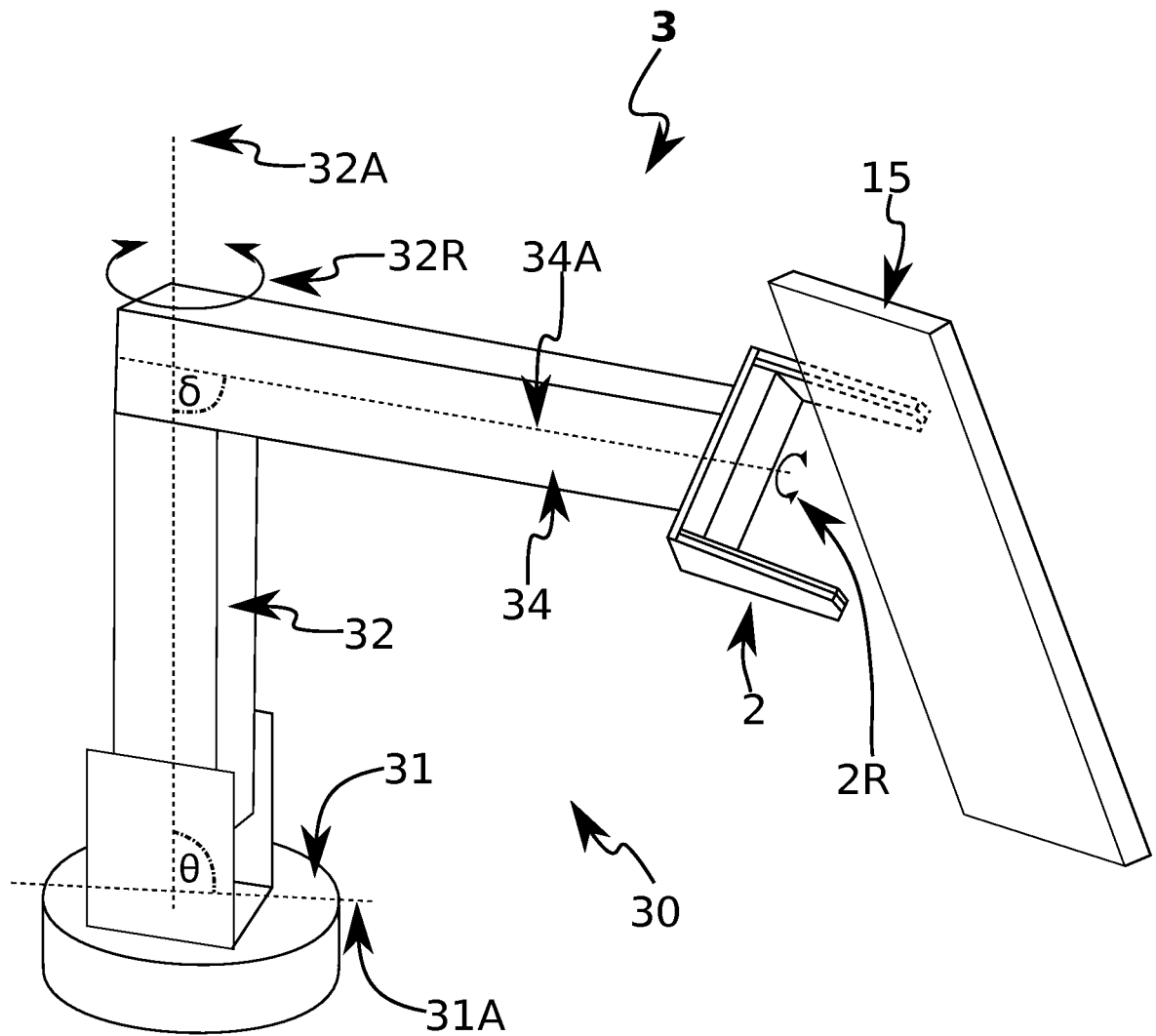

FIG. 3A depicts a third radome measuring system 3. The third radome measuring system 3 comprises the radome measuring clamp 2 mounted on a positioning apparatus 30, such as, a robotic arm 30. It should be noted that the robotic arm 30 provided in FIGS. 3A and 3B and described in the following discussion, is only a specific example of a positioning apparatus 30. In general, any actuator system can be used for handling, carrying and/or moving the measuring clamp 2. For brevity, not all element of the radome measuring clamp 2 are depicted in FIG. 3A. However, for further details on the radome measuring clamp 2 refer to FIG. 2A and FIG. 2B and the corresponding descriptions.

The robotic arm 30 can comprise a first prolonged member 32 attached to a robotic arm base 31. The attachment between the first prolonged member 32 and the robotic arm base 31 can be configured to allow for the adjustment of the angle θ created between the vertical central axis 32A of the first prolonged member and a horizontal line 31A parallel to the upper surface of the robotic arm base 31. More generally, the first prolonged member 32 can be inclined with respect to the robotic arm base 31, hence causing the angle θ to change or the change of angle θ can cause inclination of the first prolonged member 32 to change.

Further, the robotic arm 30 can comprise a second prolonged member 34. The second prolonged member 34 can be attached with the first prolonged member 32. The angle δ created between the central axis 34A of the second prolonged member and the central axis 32A of the first prolonged member can be allowed to change by the joint between the first prolonged member 32 and the second prolonged member 34. Put simply, the second prolonged member 34 can be moved relative to the first prolonged member 32.

Additionally, the rotational motion of the second prolonged member 34 as indicated by the circular double arrow 32R can be provided. This rotational motion can be provided by allowing the second prolonged member 34 to rotate with respect to the first prolonged member 32 and/or allowing the first prolonged member 32 and the second prolonged member 34 to jointly rotate with respect to the robotic arm base 31 and/or by allowing the robotic arm base 31, the first prolonged member 32 and the second prolonged member 34 to rotate as indicated by the circular double arrow 32R.

As discussed, the second prolonged member 34 can be attached on one of its ends to the first prolonged member 32. On the other end of the second prolonged member 34, the radome measuring clamp 2 can be attached. The joint between the radome measuring clamp 2 and the second prolonged member 34 can be configured to allow a rotational motion of the radome measuring clamp 2 as indicated by the circular double arrow 2R.

Each of the movements of the robotic arm 30, as discussed in the previous paragraphs, can be facilitated using actuators (such as motors) on the respective joints. The motors (not shown) can be controlled (e.g. by the measuring device 14, see FIG. 2A or 2B). The use of actuators can be advantageous as it allows the robotic arm 30 to be automatically controlled.

The movements of the robotic arm 30 and the radome measuring clamp 2 can facilitate the adjustment of the inclination of the radome 15 (e.g. of angle $\alpha$, see FIG. 1A).

The robotic arm 30 can approach the radome measuring clamp 2 towards a radome 15, as shown in FIG. 3A, such that the transmission and receiving antennas 10T and 10R (not shown in FIG. 3A) are on opposing sides of the radome 15. Hence, a radome measurement can be conducted. Furthermore, by moving the radome measuring clamp 2, measurements of multiple parts of the radome 15 can be done. For example, the robotic arm 30 can move the radome measuring clamp 2, such that a scanning of a part (or all) of the radome 15 can be achieved.

The third radome measuring system 3 can be particularly advantageous for use when the radome 15 to be measured is large. The robotic arm 30 can move the radome measuring clamp 2 in a regular pattern, such that, part or all the radome 15 can be scanned and measured.

The third radome measuring system 3 can also be advantageous for use in production lines of the radome 15 and/or of a system that may comprise the radome 15. The radomes 15 can directly be measured during production, manufacturing or assembling. The robotic arm 30 can allow for the integration of the third radome measuring system 3 in the production line, such that, it can work in synchronization with the other stages of the production line. In other words, the third radome measuring system 3 facilitates the integration of radome measurements in production lines of radomes 15 and/or systems comprising the radome 15. An example may be the integration of the radome measurements in the car production line, wherein radar systems are implemented behind the bumpers of the car—hence the bumpers act as radomes 15 and their dielectric properties can be measured.

The third radome measuring system 3 is depicted in FIG. 3A and discussed in the corresponding paragraphs as comprising only one radome measuring clamp 2 attached to one robotic arm 30. However, it will be understood that multiple positioning apparatuses 30 can be used. This embodiment is illustrated in FIG. 3B, with two robotic arms 30, each of them being attached to a corresponding radome measuring clamp 2 and simultaneously measuring the radome 15. The third radome measuring system 3 with multiple robotic arms 30, wherein each of them can handle a respective radome measuring clamp 2, can be used to measure multiple targeted areas 56 (see FIG. 7B) of the same radome 15 or object under test 15.

Figure 4:
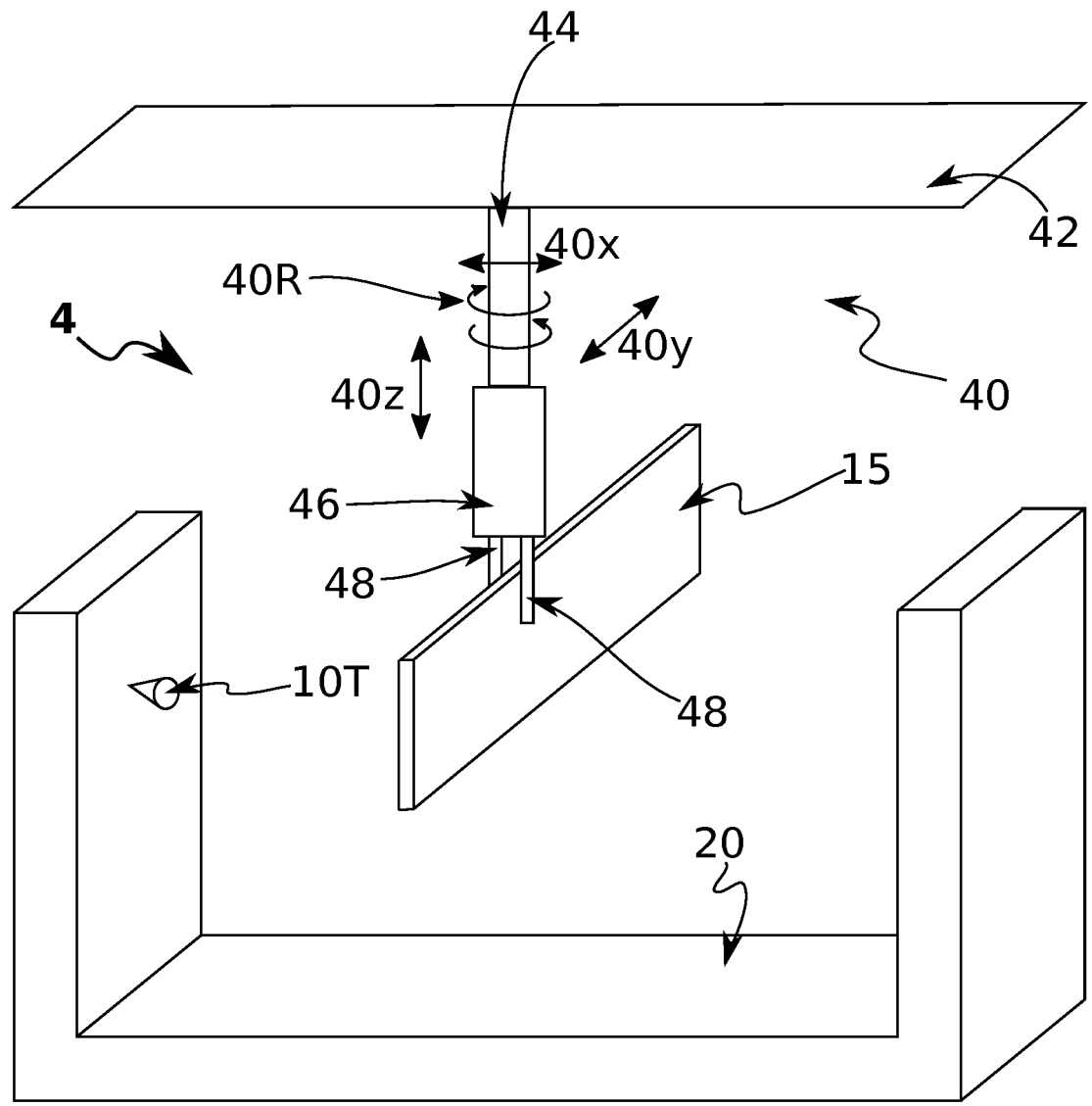
FIG. 4 depicts a schematic of a radome measuring system comprising a radome handling apparatus and a clamp structure.

FIG. 4 depicts a fourth radome measuring system 4. The fourth radome measuring system 4 comprises a radome handling apparatus 40. Further, in FIG. 4 the radome measuring clamp 2 is depicted. A 3-dimensional cartesian reference system is also provided in FIG. 4 and is herein used as reference for describing the movements of the radome 15.

As it will be clarified by the following description, the difference between the fourth radome measuring system 4, depicted in FIG. 4 and the third radome measuring system 3 depicted in FIG. 3A, is that the radome 15 is moved instead of the measuring clamp 2. That is, in the embodiment of FIG. 3A, the measuring clamp 2 is attached to the positioning apparatus 30 which can be configured to move the measuring clamp 2 in different positions. In FIG. 4, the radome 15 can be attached to a radome handling apparatus 40 which can be configured for moving the radome 15. Furthermore, though not depicted in any of the figures, a combination of both can be possible or even preferable. That is, both the measuring clamp 2 and the radome 15 can be handled by respective apparatuses (i.e. positioning apparatus 30 and radome handling apparatus 40).

The radome handling apparatus 40 can be configured for moving the radome 15. It can comprise a mounting frame 40. The mounting frame 40 can be configured to support the weight of the radome handling apparatus 40 and the radome 15.

Attached to the mounting frame 42 can be an elongated component 44. The elongated component 44 can be joint on the other end with the grabbing element 46. The grabbing element 46 can slide through the elongated component 44, thus realizing a movement according to the z-axis as depicted by the arrow 40z.

The grabbing element 46 can be configured for grabbing and holding the radome 15. The grabbing element can comprise attaching elements 48, such as, two attaching elements 48 that can be positioned on two sides of the radome 15, attached with the radome 15 and fix the radome 15 to the grabbing element 15. The grabber element 46 can be configured to also release the radome 15. In other words, the grabber element 40 can be configured to grab and release the radome 15 multiple times.

Further, the elongated member 44 and the grabber element 46 can be moved according to the x- and y-axis as depicted by the arrows 40x and 40y respectively. Thus, the radome 15 can be moved in space according to the x-, y- and z-directions, with reference to the reference system provided in FIG. 4. Additionally, the elongated member 44 and the grabber element 46 can be rotated clockwise and counterclockwise, with respect to the z-axis as also indicated by the circular arrows 40R. Additionally, the radome 15 can be inclined (i.e. the incidence angle $\alpha$ can be adjusted, see FIGS. 1A to 2B).

Preferably, the movements of the radome handling apparatus 40 can be generated by actuators (not shown). In such embodiments a control system (e.g. within the measuring device 14) can be configured to control the actuators of the radome handling system 40, to move the radome 15. Hence, the movement of the radome can be automatically done.

The mounting frame 42 can further be configured to guide the movements of the radome handling apparatus 40, particularly the movements according to the x- and y-axis. For example, guiding tracks can be provided in the mounting frame 42, wherein the elongated component 44 can slide or be guided.

The radome handling apparatus 40 can be particularly advantageous for use when the radome 15 to be measured is large. The radome handling apparatus 40 can move the radome 15 with respect to the radome measuring clamp 2, such that, part or all of the radome 15 can be measured (i.e. can be positioned within the line-of-sight of the transmission antenna 10T and receiving antenna 10R, see FIGS. 2A, 2B).

The radome handling apparatus 40 can also be advantageous for use in production lines of the radome 15 and/or a system that may comprise the radome 15. The radomes 15 can directly be measured during production, manufacturing or assembling. The radome handling apparatus 40 can allow for the integration of a radome measuring stage in the production line and can be configured to work in synchronization with the other stages and devices of the production line. For example, the radome handling system 40 can transport a radome 15 from a first location (e.g. a storing or buffering location for the radomes 15) to the radome measuring clamp 2, wherein the radome can be measured. Further, the radome moving system 40 can transport the radome 15 to another buffering location or stage of the production line. Afterwards, the radome handling system 40 can repeat this process with another radome 15 and thus multiple radomes 15 can be sequentially measured by the radome measuring clamp.

Figure 5:
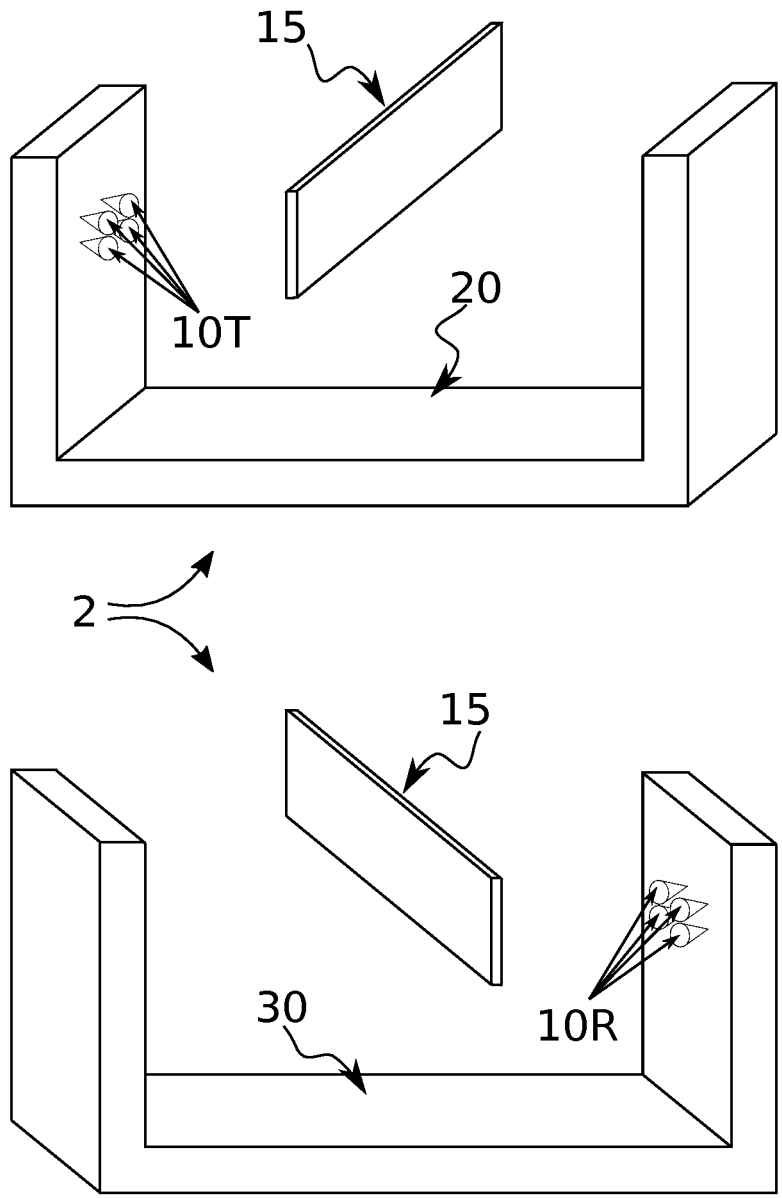
FIG. 5 depicts a schematic of a radome measuring system comprising multiple transmission antennas and multiple receiving antennas mounted in a clamp structure.

FIG. 5 depicts a further embodiment of the radome measuring clamp 2 (see also FIGS. 2A and 2B). In the embodiment depicted in FIGS. 2A and 2B, the radome measuring clamp 2 comprises one transmission antenna 10T and one receiving antenna 10R. In the embodiment depicted herein in FIG. 5, the radome measuring clamp 2 instead comprises multiple transmission antennas 10T and multiple receiving antennas 10R (as depicted by the two different views of the radome measuring clamp 2 in FIG. 5). The multiple transmission antennas 10T and multiple receiving antennas 10R can be aligned with each other. For example, the transmission antennas 10T and receiving antennas 10R can be aligned in pairs, such that, a signal transmitted from the transmission antenna 10T of a pair is received by the receiving antenna 10R of the pair.

The multiple antennas 10 can also be arranged such that, the electromagnetic waves transmitted by at least one single transmission antenna 10T are received by multiple receiving antennas 10R or vice-versa electromagnetic waves transmitted by multiple transmission antennas 10T are received by at least one single receiving antennas 10R.

The use of multiple antennas 10T and 10R can be advantageous as it allows the measuring of multiple points (or parts) or the radome 15 simultaneously. Hence, the process of radome measuring can be achieved in a shorter time as compared to the time needed when only one pair of antennas 10 is used (e.g. as depicted in FIG. 2A).

A single radome measurement, in this embodiment, can consist of triggering all the transmission antennas 10T and all the receiving antennas 10R. In this case, multiple measuring points 54 (see FIG. 7A) can be simultaneously measured. A measurement can also be realized by activating different numbers of transmission antennas 10T and receiving antennas 10R. For example, one transmission antenna 10T can be triggered and four receiving antennas 10R can be activated to receive the electromagnetic waves emitted by the transmission antenna 10T.

Throughout the description of the various embodiments with respect to FIGS. 1A to 5, the transmission antenna 10T was configured only as an electromagnetic wave radiator and the receiving antenna 10R was configured only as an electromagnetic wave receiver. However, in some embodiments, the transmission antenna 10T and receiving antenna 10R can be configured as transceiver antennas 10, that is, can transmit and receive electromagnetic waves. In some embodiments, transmission and receiving of electromagnetic waves can be multiplexed in time i.e. the transceiver antenna 10 can act for a period of time as a transmission antenna 10T and for another period of time as a receiving antenna 10R. Alternatively or additionally, the transmission and receiving of electromagnetic waves can be multiplexed in the frequency domain—i.e. the transceiver antenna 10 can simultaneously act as a receiving antenna 10R and transmission antenna 10T, however using different frequency bands for each mode of operation. Using time multiplexing and/or frequency multiplexing can avoid the interference that can be created between the signals that are transmitted and signals that are received. Alternatively, the transceiver antennas 10 can operate as a transmitter and receiver simultaneously and on the same frequency band and signal processing techniques can be used to avoid the interference caused by the transmitted and receiving signals operating on the same frequency and time band.

Figure 6:
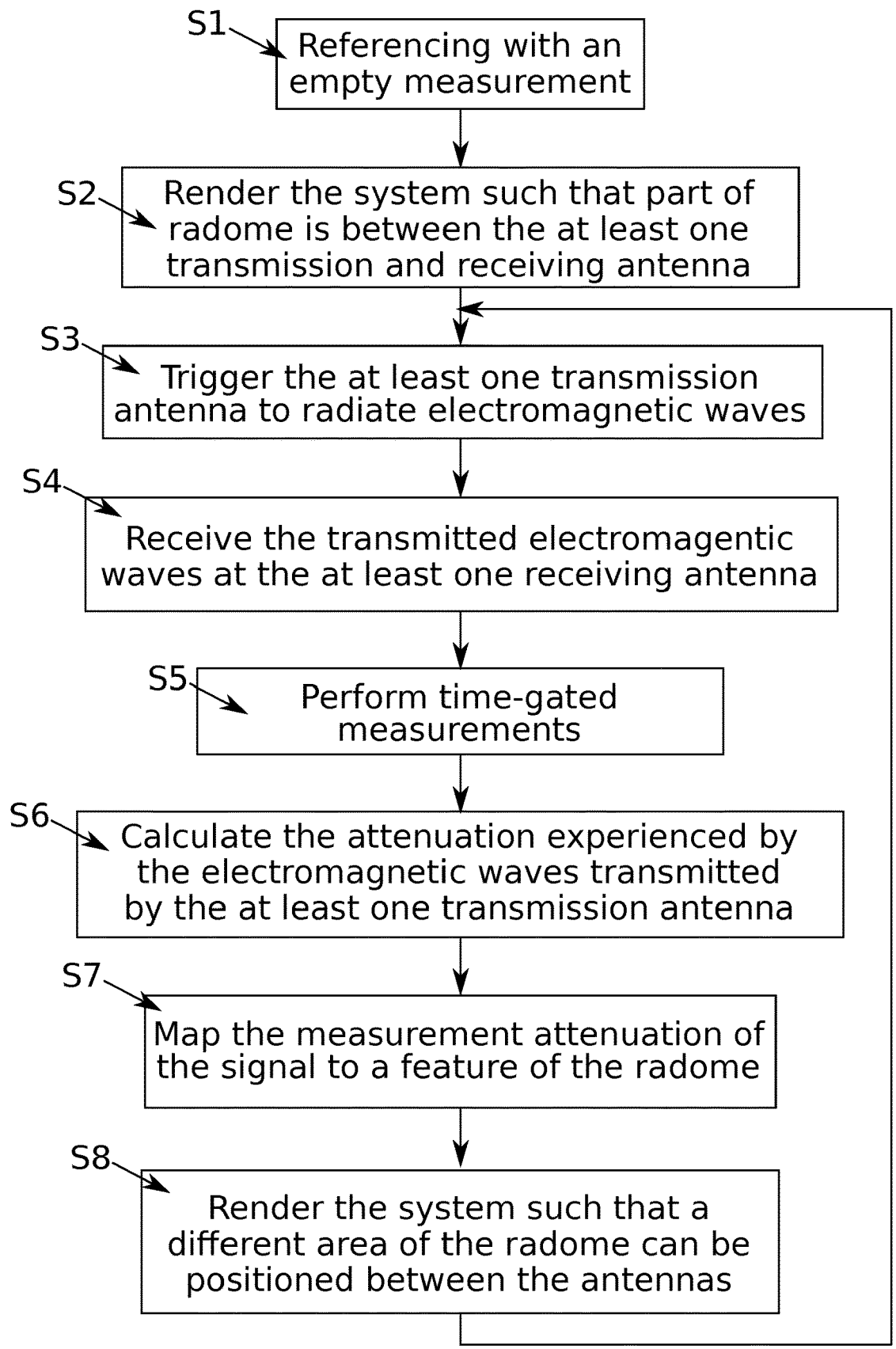
FIG. 6 depicts a flowchart of a method of measuring dielectric characteristics of a radome.

FIG. 6 depicts a flowchart of a method of measuring dielectric characteristics of a radome. The method depicted in FIG. 6 can be used or carried out by any of the system embodiments depicted in and described with reference to FIGS. 1A to 5. Thus, reference to the elements of the system embodiments depicted in and described with reference to FIGS. 1A to 5 is herein made, during the description of the method of FIG. 6. Further, the term "system" in the following paragraphs describing FIG. 6, can refer to any of the systems depicted in and described with reference to FIGS. 1A to 5.

In a step S1, the method can comprise referencing with an empty measurement. This step consists of doing a measurement (i.e. performing steps S3, S4, S5 and S6) without the radome 15 positioned between the antennas 10. This measurement allows for the measuring of dielectric properties of the medium(s) between the transmission antenna 10T and receiving antenna 10R. Step S1 can provide a better accuracy of the radome measurement, as the dielectric properties of medium between the antennas 10 can be measured and compensated during the radome measurements (e.g. in step S6). Furthermore, as the medium(s) between the antennas 10 can change, e.g. due to changing of temperature, humidity, dust, etc., it can be advantageous to perform the referencing with an empty measurement shortly, such as 1 to 10 seconds, before the radome measuring.

Step S1 can comprise transmitting a testing signal from the at least one transmission antenna 10T and receiving the testing signal at the at least one receiving antenna 10R, without the radome 15 being positioned between the at least one transmission antenna 10T and the at least one receiving antenna 10R. Further, step S1 can comprise calculating the attenuation of the testing signal, wherein the attenuation of the testing signal is caused by the medium(s) between the at least one transmission antenna 10T and at least one receiving antenna 10R.

In a step S2, the system can be rendered such that at least a part or all of the radome 15 can be placed between at least one transmission antenna 10T and at least one receiving antenna 10R. Thus, electromagnetic waves transmitted by the transmission antenna 10T can traverse the radome 15 and can be received at the receiving antenna 10R. As a result, the dielectric characteristics of the part of the radome positioned between the antennas 10 can be measured.

In a step S3, the at least one transmission antenna 10T can be triggered to emit electromagnetic waves. The emitted electromagnetic waves by the at least one transmission antenna 10T can pass through the radome 15 and can reach the receiving antenna 10R. The emitted electromagnetic waves can be received in a step S4 by the at least one receiving antenna 10R.

During the transmission of the electromagnetic waves from the at least one transmitted antenna 10T, through the radome 15 and to the at least one receiving antenna 10R, reflections can be created. As previously discussed, the reflection can be avoided using time-gating. Thus, in a step S5, the method comprises performing time-gated measurements, such that the received signal can be measured only on selected time-slots during which the signal is not interfered (or at least is slightly interfered) by reflections. That is, step S5 facilitates neglecting the reflections and/or diffractions, such that only the effect of the radome 15 on the direct path (or shortest paths) signal can be measured or considered.

The difference between the transmission power used by the transmission antenna 10T in step S3 and the power of the received electromagnetic waves in step S4 can be used in step S6 to measure attenuation experienced by the electromagnetic waves during the propagation from the transmission antenna 10T to the receiving antenna 10R. The attenuation is caused by the medium between the antennas 10 and the radome 15. For a more accurate result, the attenuation of the medium between the antennas can be compensated for using the reference measurement on step S1. Thus, only attenuation caused by the radome 15 can be considered.

Further, in a step S7 the measured attenuation of the signal can be mapped to a feature of the radome 15. For example, in this step it can be determined based on the measured attenuation (and/or other transmission or reflection properties of the radome) if the radome 15 can be in accordance with predefined requirements regarding the use of the radome 15 with a radar system.

In a step S8, the system for measuring the radome can be rendered such that a different area of the radome 15 can be positioned between the antennas 10. This can be achieved by changing the relative position between the antennas 10 and the radome 15—i.e. the radome 15 or the antennas 10 or both are moved. Step S8 can allow for a different area of the radome 15 to be measured.

After step S8 the method can continue with step S3 and proceed as discussed above.

Figure 7A:
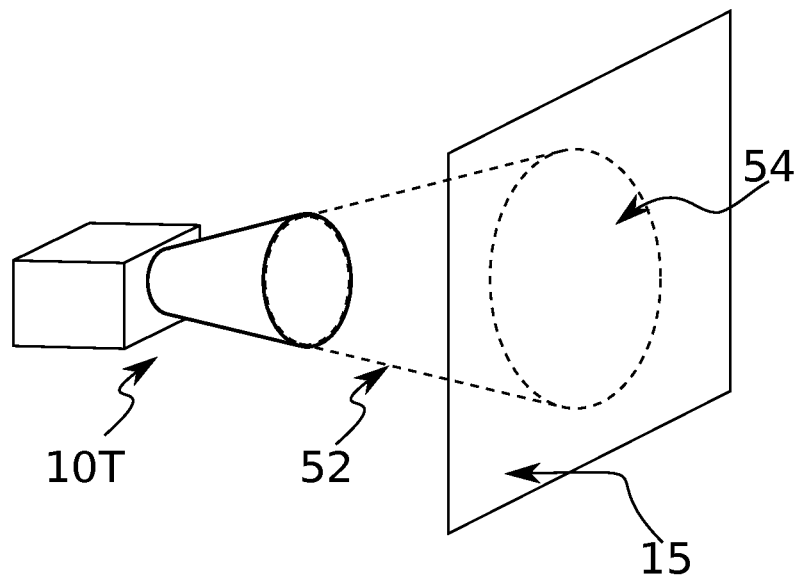
FIGS. 7A and 7B illustrate how an area of a radome can be measured.
Figure 7B:
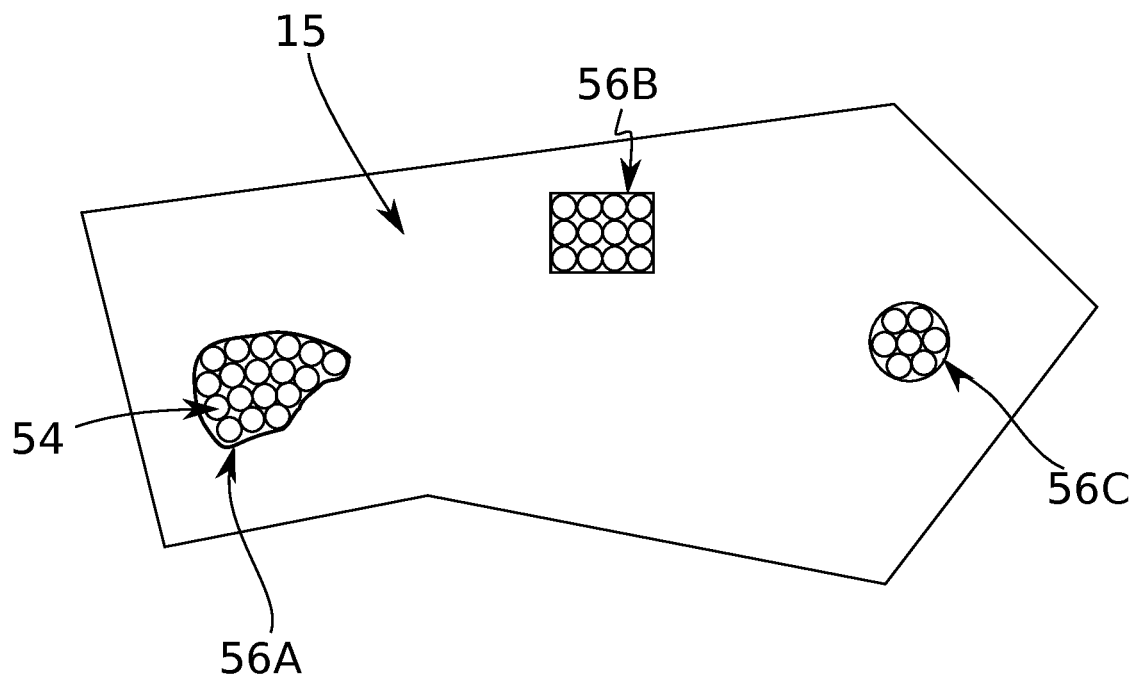

FIG. 7A and FIG. 7B illustrate how an area of a radome 15 can be measured. In FIG. 7A a transmission antenna 10T is depicted. For example, the transmission antenna 10T can be a horn antenna 10T. The transmission antenna 10T can be configured to emit electromagnetic waves in a specific direction, as depicted by the transmission beam 52.

The transmission beam 52 represents the volume wherein most of the electromagnetic energy radiated by the transmission antenna 10T can be concentrated. The transmission beam 52 may correspond to the main lobe of the transmission antenna 10T. In FIG. 7A, the transmission beam 52 is depicted as truncated-cone-shaped. In general, the shape of the transmission beam 52 depends on the shape, structure, type of antenna 10T and/or on the operational frequency band of the transmission antenna 10T.

The intersection of the transmission beam 52 with the radome 15 comprises the measuring area 54. The measuring area 54 can be the smallest area of a radome 15 that can be measured using one transmission antenna 10T and during one measurement, i.e. during one transmission of electromagnetic waves from the transmission antenna 10T to the receiving antenna 10R (not shown in this figure). The measuring area 54 can also be defined as the part of the radome 15 that is traversed by electromagnetic waves that are transmitted by the transmission antenna 10T and are received by the at least one receiving antenna 10R (not shown in this figure) during one measurement. That is, after one measurement is completed (i.e. one measurement can correspond to one cycle of the method depicted in FIG. 6) the measuring area 54 of the radome is measured.

FIG. 7B illustrates the measuring of only some targeted areas of the radome 15. The targeted area 56 can comprise the part of the radome 15 that need to be measured. The targeted area can include the whole radome 15 or a part of it. In the latter case, multiple targeted areas 56 can be required to be measured. As depicted in FIG. 7B, 3 targeted areas 56A, 56B and 56C are required to be measured. The targeted areas can comprise regular shapes, such as, rectangular (e.g. target area 56B), triangular, elliptic (e.g. targeted area 56C), hexagonal, octagonal, etc. In general, the targeted shape can comprise any shape, e.g. the irregular shape of the targeted area 56A.

The targeted area 56 can be measured by "scanning" it, using any of the systems for radome measurement discussed with respect to FIGS. 1A to 5. The targeted area 56 can be measured by measuring at least one measurement point 54 that lies within or partly within the targeted area 54.

As used herein, including in the claims, singular forms of terms are to be construed as also including the plural form, unless the context indicates otherwise. Thus, it should be noted that as used herein, the singular forms "a," "an," and "the" include plural references unless the context clearly dictates otherwise.

Throughout the description and claims, the terms "comprise", "including", "having", and "contain" and their variations should be understood as meaning "including but not limited to", and are not intended to exclude other components.

The present invention also covers the exact terms, features, values and ranges etc. in case these terms, features, values and ranges etc. are used in conjunction with terms such as about, around, generally, substantially, essentially, at least etc. (i.e., "about 3" shall also cover exactly 3 or "substantially constant" shall also cover exactly constant).

The term "at least one" should be understood as meaning "one or more", and therefore includes both embodiments that include one or multiple components. Furthermore, dependent claims that refer to independent claims that describe features with "at least one" have the same meaning, both when the feature is referred to as "the" and "the at least one".

It will be appreciated that variations to the foregoing embodiments of the invention can be made while still falling within the scope of the invention. Alternative features serving the same, equivalent or similar purpose can replace features disclosed in the specification, unless stated otherwise. Thus, unless stated otherwise, each feature disclosed represents one example of a generic series of equivalent or similar features Use of exemplary language, such as "for instance", "such as", "for example" and the like, is merely intended to better illustrate the invention and does not indicate a limitation on the scope of the invention unless so claimed. Any steps described in the specification may be performed in any order or simultaneously, unless the context clearly indicates otherwise.

All of the features and/or steps disclosed in the specification can be combined in any combination, except for combinations where at least some of the features and/or steps are mutually exclusive. In particular, preferred features of the invention are applicable to all aspects of the invention and may be used in any combination.

The invention claimed is:

1. A radome measuring system configured to perform a radome measurement, comprising:
   at least one transmission antenna configured for emitting electromagnetic waves;
   at least one receiving antenna configured for receiving electromagnetic waves;
   a measuring device configured to measure at least one difference between the transmitted and received electromagnetic waves for inferring a feature of a radome positioned between the at least one transmission antenna and the at least one receiving antenna; and
   a clamp structure, the clamp structure comprising:
      a transmitter mount of the clamp configured for mounting at least one transmission antenna;
      a receiver mount of the clamp configured for mounting at least one receiver antenna; and
      a base frame wherein the transmitter mount of the clamp and receiver mount of the clamp are attached such that a substantially U-shaped structure of the clamp is created.

2. The radome measuring system according to claim 1, further comprising at least one positioning apparatus, the positioning apparatus configured to move the at least one transmission antenna and the at least one receiving antenna;
   wherein the clamp structure is attached to the positioning apparatus and the positioning apparatus can move the clamp structure.

3. The radome measuring system according to claim 2, wherein a joint between the clamp structure and the positioning apparatus is configured to provide rotation of the clamp structure.

4. The radome measuring system according to claim 1, further comprising a radome handling apparatus that is configured to move the radome.

5. The radome measuring system according to claim 1, wherein the distance between the at least one transmission antenna and the at least one receiving antenna is between 10 centimeters to 1 meter.

6. The radome measuring system according to claim 1, wherein the radome measuring system is configured to measure at least one of:
   attenuation of an electromagnetic wave traversing through the radome;
   reflection of electromagnetic waves caused by the radome;
   deflection of a main beam of the transmitter antenna;
   increasing of a beam width of the transmission antenna;
   extension of sidelobes of the transmission antenna; or
   scattering parameters, or S-parameters, of the transmission of electromagnetic waves from the transmission antenna to the receiver antenna.

7. The radome measuring system according to claim 1, wherein the at least one transmission antenna and the at least one receiving antenna are aligned such that a main lobe of the at least one transmission antenna and a main lobe of the at least one receiving antenna intersect.

8. The radome measuring system according to claim 1, wherein the transmission antenna is configured for emitting or radiating electromagnetic waves with a certain frequency of at least 20 gigahertz and at most 130 gigahertz.

9. The radome measuring system according to claim 1, further comprising at least one reflector;
   wherein the at least one reflector is positioned between the transmission antenna and the radome and/or the receiving antenna and the radome.

10. The radome measuring system according to claim 9, wherein the at least one reflector is positioned inclined, with an inclination angle between 30 degrees to 80 degrees or between 100 degrees to 150 degrees.

11. The radome measuring system according to claim 1, further comprising at least one positioning apparatus, the positioning apparatus configured to move the at least one transmission antenna and the at least one receiving antenna.

12. A method of measuring the effects of a radome on electromagnetic waves traversing through the radome, using a radome measuring system comprising:
   at least one transmission antenna configured for emitting electromagnetic waves;
   at least one receiving antenna configured for receiving electromagnetic waves;
   a measuring device configured to measure at least one difference between the transmitted and received electromagnetic waves for inferring a feature of a radome positioned between the at least one transmission antenna and the at least one receiving antenna; and
   a clamp structure, the clamp structure comprising:
      a transmitter mount of the clamp configured for mounting at least one transmission antenna;
      a receiver mount of the clamp configured for mounting at least one receiver antenna; and
      a base frame wherein the transmitter mount of the clamp and receiver mount of the clamp are attached such that a substantially U-shaped structure of the clamp is created, the method comprising the steps of:
   (a) providing a radome between at least one transmission antenna and at least one receiving antenna;
   (b) triggering the at least one transmission antenna to radiate electromagnetic waves;
   (c) receiving the transmitted electromagnetic waves in step (b) by the at least one receiving antenna;
   (d) measuring at least one difference between the transmitted and received electromagnetic waves; and
   (e) inferring a feature of the radome based on the at least one difference between the transmitted and received electromagnetic waves.

13. The method according to claim 12, further comprising performing referencing with an empty measurement by performing steps (b), (c) and (d) before providing the radome between the at least one transmission antenna and the at least one receiving antenna.

14. The method according to claim 12, wherein steps (b), (c) and (d) are performed at least one time before performing step (e).

15. The method according to claim 12, the method further comprising step:
   (f) changing the relative position between the radome and the at least one transmission antenna.

16. The method according to claim 15, wherein steps (b), (c), (d) and (f) are performed at least one time before performing step (e).

17. The method according to claim 15, wherein steps (b), (c), (d), (e) and (f) are performed at least one time.

18. The method according to claim 12, further comprising performing time-gating before step (d), such that interference of the received signal considered in step (d) is minimized.

* * * * *